United States Patent
Chen

(10) Patent No.: US 9,036,685 B2
(45) Date of Patent: May 19, 2015

(54) CONNECTING INTERFACE UNIT AND MEMORY STORAGE DEVICE

(71) Applicant: PHISON ELECTRONICS CORP., Miaoli (TW)

(72) Inventor: Wei-Yung Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/061,762

(22) Filed: Oct. 24, 2013

(65) Prior Publication Data
US 2015/0049849 A1 Feb. 19, 2015

(30) Foreign Application Priority Data

Aug. 13, 2013 (TW) .............................. 102129002 A

(51) Int. Cl.
*H04L 5/16* (2006.01)
*G06F 1/06* (2006.01)
*H04L 7/033* (2006.01)
*G06F 12/02* (2006.01)

(52) U.S. Cl.
CPC ............... *G06F 1/06* (2013.01); *H04L 7/0331* (2013.01); *G06F 12/0246* (2013.01)

(58) Field of Classification Search
CPC ........ H03L 7/089; H03L 7/18; H03L 2207/06
USPC ......... 375/229, 230, 231, 232, 233, 234, 235, 375/327, 376
See application file for complete search history.

(56) References Cited

U.S. PATENT DOCUMENTS

| | | | |
|---|---|---|---|
| 2003/0161430 A1* | 8/2003 | Sou .............................. | 375/376 |
| 2006/0034395 A1* | 2/2006 | Evans et al. ................... | 375/326 |
| 2007/0009073 A1* | 1/2007 | Kushiyama ................... | 375/355 |
| 2007/0285178 A1* | 12/2007 | Werker ........................... | 331/16 |
| 2008/0162759 A1* | 7/2008 | Garlepp et al. ............... | 710/110 |
| 2013/0076415 A1* | 3/2013 | Hara et al. .................... | 327/159 |

* cited by examiner

*Primary Examiner* — Syed Haider
(74) *Attorney, Agent, or Firm* — Jianq Chyun IP Office

(57) ABSTRACT

A connecting interface unit and a memory storage device without a crystal oscillator are provided and include following circuits. A phase detector detects a phase difference between a first reference signal and an input signal from a host system to generate a phase signal. A signal detecting circuit detects a signal character difference between the input signal and the first reference signal for a signal generating circuit to generate a second reference signal. A phase interpolator generates a clock signal according to the phase signal and the second reference signal. A sampling circuit generates an input data signal according to the clock signal. A transmitter circuit modulates an output data signal according to the clock signal or the second reference signal to generate an output signal, and transmits it to the host system. Accordingly, the connecting interface unit conforms to the specification of a transmission standard.

34 Claims, 15 Drawing Sheets

| Temperature | Voltage V_t (digital data) | Code used by the digital oscillator |
|---|---|---|
| ? | 0.80 | 10040 |
| 20 | 0.78 | 10030 |
| 30 | 0.76 | 10020 |
| 40 | 0.74 | 10010 |
| 50 | 0.72 | 10000 |
| 60 | 0.7 | 9990 |
| ⋮ | ⋮ | ⋮ |
| 100 | 0.62 | 9923 |
| ? | 0.6 | 9903 |

1500

CONNECTING INTERFACE UNIT AND MEMORY STORAGE DEVICE

CROSS-REFERENCE TO RELATED APPLICATION

This application claims the priority benefit of Taiwan application serial no. 102129002, filed on Aug. 13, 2013. The entirety of the above-mentioned patent application is hereby incorporated by reference herein and made a part of this specification.

BACKGROUND

1. Technology Field

The invention relates to a connecting interface unit, and more particularly, to a connecting interface unit and a memory storage device not including a crystal oscillator.

2. Description of Related Art

Along with the rapid growth of the market for digital cameras, cell phones, and MP3 players in recent years, consumers' demand for storage media has increased drastically. Due to their characteristics such as data non-volatility, low power consumption, compact size, and non-mechanical structure, rewritable non-volatile memory modules (e.g. flash memory) are very suitable for being built in the above exemplified portable multimedia devices.

Generally speaking, a rewritable non-volatile memory module is coupled to a host system via a connecting interface unit. Such connecting interface unit is compliant with a transmission standard, for example, a Universal Serial Bus (USB) standard. Data transmitted between the host system and the connecting interface unit is transmitted at a specific frequency. Hence the connecting interface unit is required to be able to generate a clock signal at this specific frequency. In order to conform to the specification of the transmission standard, the frequency of such clock signal must be stable. Accordingly, the clock signal is generally generated by a crystal oscillator disposed in the connecting interface unit. However, compared to other types of oscillators, crystal oscillators cost more. Therefore, persons skilled in the art are concerned about how to design a connecting interface unit without use of a crystal oscillator and to make the connecting interface unit conform to the specification of a transmission standard.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a connecting interface unit and a memory storage device that conform to the specification of a transmission standard without using a crystal oscillator.

An exemplary embodiment of the invention proposes a connecting interface unit including a phase detector, a filter, a signal detecting circuit, a signal generating circuit, a first phase interpolator, a first sampling circuit, and a transmitter circuit. The phase detector is configured to receive an input signal from a host system, and to detect a phase difference between the input signal and a first reference signal to generate a first phase signal. The filter is coupled to the phase detector and is configured to filter the first phase signal to generate a second phase signal. The signal detecting circuit is configured to receive the input signal, and to detect a signal character difference between the input signal and the first reference signal to generate a first difference signal. The signal generating circuit is coupled to the signal detecting circuit and is configured to generate at least one second reference signal according to the first difference signal. The first phase interpolator is coupled to the filter and the signal generating circuit and is configured to generate a first clock signal according to the second phase signal and the second reference signal. The first sampling circuit is coupled to the first phase interpolator and is configured to generate an input data signal according to the first clock signal. The transmitter circuit is configured to modulate an output data signal according to the first clock signal or one of the second reference signal to generate an output signal, and to transmit the output signal to the host system.

An exemplary embodiment of the invention proposes a memory storage device including a connecting interface unit, a rewritable non-volatile memory module and a memory controller. The connecting interface unit is configured to be coupled to a host system. The rewritable non-volatile memory module includes a plurality of physical erasing units. The memory controller is coupled to the connecting interface unit and the rewritable non-volatile memory module. The connecting interface unit includes a phase detector, a filter, a signal detecting circuit, a signal generating circuit, a first phase interpolator, a first sampling circuit, and a transmitter circuit. The phase detector is configured to receive an input signal from the host system, and to detect a phase difference between the input signal and a first reference signal to generate a first phase signal. The filter is coupled to the phase detector and is configured to filter the first phase signal to generate a second phase signal. The signal detecting circuit is configured to receive the input signal, and to detect a signal character difference between the input signal and the first reference signal to generate a first difference signal. The signal generating circuit is coupled to the signal detecting circuit and is configured to generate at least one second reference signal according to the first difference signal. The first phase interpolator is coupled to the filter and the signal generating circuit and is configured to generate a first clock signal according to the second phase signal and the second reference signal. The first sampling circuit is coupled to the first phase interpolator and is configured to generate an input data signal according to the first clock signal. The transmitter circuit is configured to modulate an output data signal according to the first clock signal or one of the second reference signal to generate an output signal, and to transmit the output signal to the host system.

Based on the above, the connecting interface unit and the memory storage device proposed by the exemplary embodiments of the invention make it possible to generate a signal by means of the input signal from the host system, and the signal is utilized for transmitting data to the host system. In this way, there is no need to dispose a crystal oscillator in the connecting interface unit.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, embodiments accompanied with drawings are described in detail as follows.

DETAILED DESCRIPTION OF DISCLOSED EMBODIMENTS

Figure 1A:
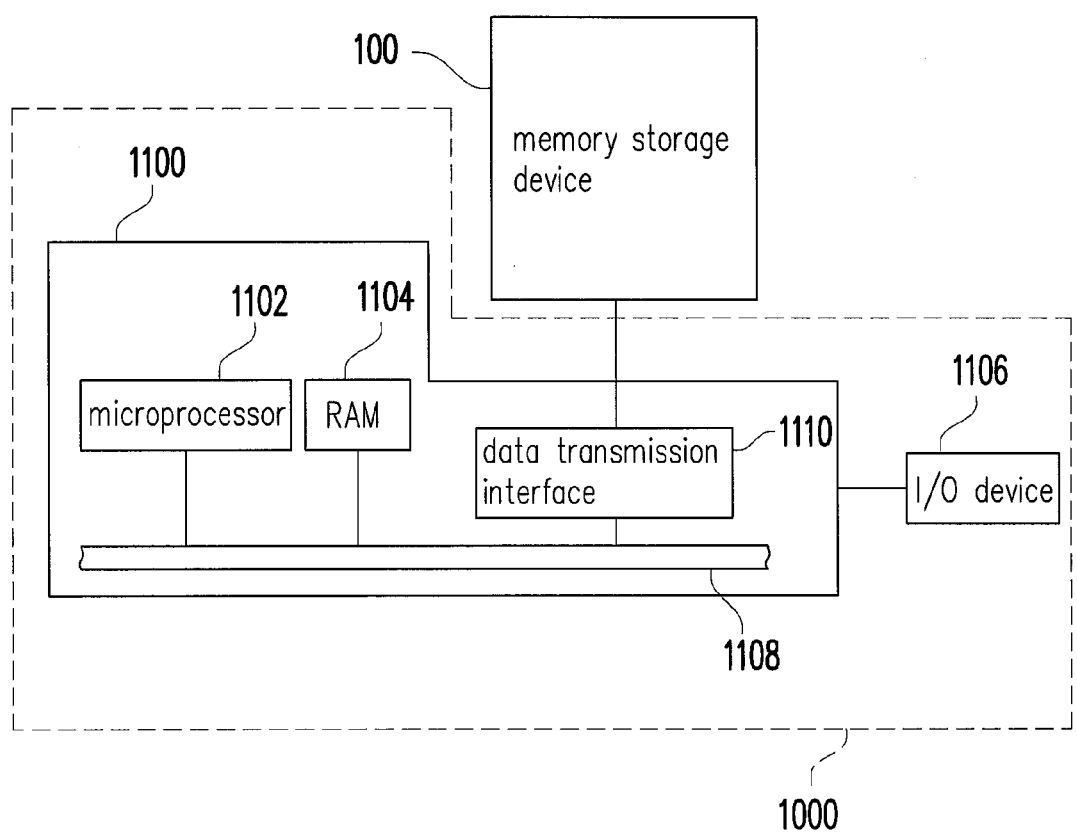
FIG. 1A illustrates a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally speaking, a memory storage device (also referred as memory storage system) includes a rewritable non-volatile memory module and a controller (also referred as control circuit). The memory storage device is normally used together with a host system, so that the host system writes data into or reads data from the memory storage device.

FIG. 1A illustrates a host system and a memory storage device according to an exemplary embodiment of the invention.

Figure 1B:
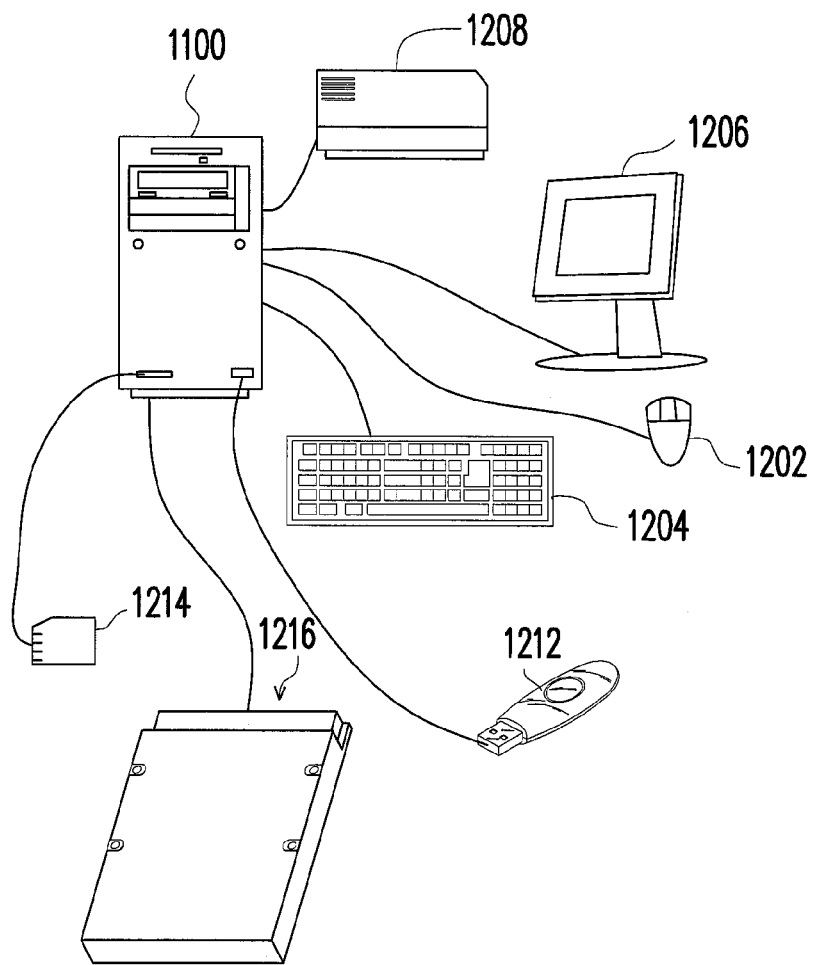
FIG. 1B is a schematic diagram of a computer, an input/output device, and a memory storage device according to an exemplary embodiment of the invention.

Referring to FIG. 1A, a host system 1000 generally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices shown in FIG. 1B are not intended to limit the I/O device 1106, and the I/O device 1106 may further include other devices.

According to an exemplary embodiment of the invention, a memory storage device 100 is coupled to other elements of the host system 1000 through the data transmission interface 1110. By using the microprocessor 1102, the RAM 1104 and the I/O device 1106, the data is written in or read from the memory storage device 100. For instance, the memory storage device 100 may be a rewritable non-volatile memory storage device, such as a flash drive 1212, a memory card 1214, or a solid state drive (SSD) 1216, as shown in FIG. 1B.

Figure 1C:
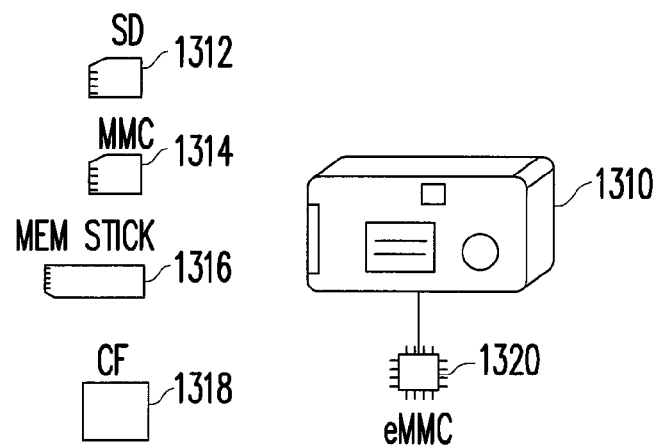
FIG. 1C is a schematic diagram of a host system and a memory storage device according to an exemplary embodiment of the invention.

Generally speaking, the host system 1000 is any system substantially operated in combination with the memory storage device 100 for storing data. Even though the host system 1000 is described as a computer system in the present exemplary embodiment, in another exemplary embodiment of the invention, the host system 1000 may be a digital camera, a video camera, a telecommunication device, an audio player, or a video player. For instance, in a case where the host system is a digital camera (video camera) 1310, the rewritable non-volatile memory storage device is then a Secure Digital (SD) card 1312, a MultiMediaCard (MMC) 1314, a memory stick 1316, a CompactFlash (CF) card 1318 or an embedded storage device 1320 (as shown in FIG. 1C). The embedded storage device 1320 includes an embedded MMC (e-MMC). It is worth mentioning that the e-MMC is directly coupled to a substrate of the host system.

Figure 2:
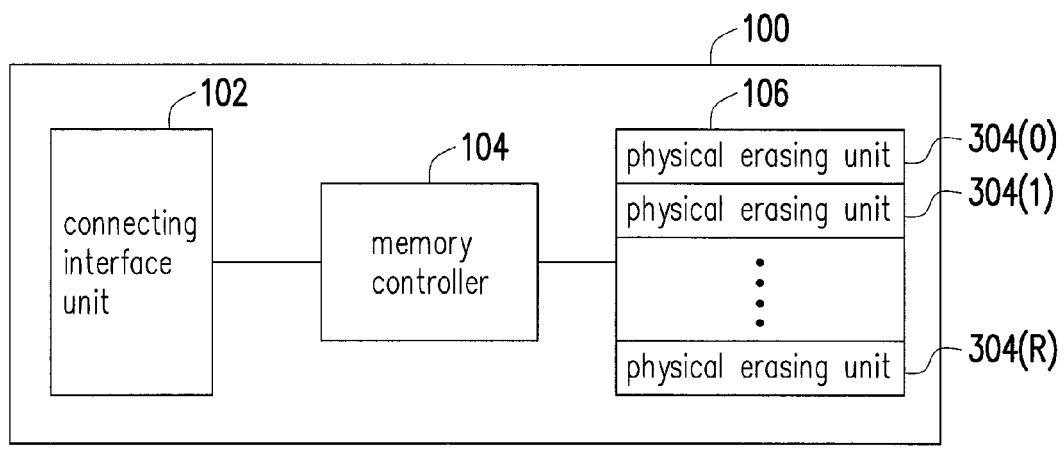
FIG. 2 is a schematic block diagram of the memory storage device shown in FIG. 1A.

FIG. 2 is a schematic block diagram of the memory storage device shown in FIG. 1A.

Referring to FIG. 2, the memory storage device 100 includes a connecting interface unit 102, a memory controller 104, and a rewritable non-volatile memory module 106.

In the present exemplary embodiment, the connecting interface unit 102 is compliant with a Universal Serial Bus (USB) standard. However, it should be understood that the invention is not limited thereto. The connecting interface unit 102 may also be compliant with a Parallel Advanced Technology Attachment (PATA) standard, an Institute of Electrical and Electronic Engineers (IEEE) 1394 standard, a Peripheral Component Interconnect Express (PCI Express) standard, a Serial Advanced Technology Attachment (SATA) standard, a Secure Digital (SD) interface standard, an Ultra-High Speed-I (UHS-I) interface standard, an Ultra-High Speed-II (UHS-II) interface standard, a Memory Stick (MS) interface standard, a MultiMediaCard (MMC) interface standard, an embedded MultiMediaCard (e-MMC) interface standard, a Universal Flash Storage (UFS) interface standard, a CompactFlash (CF) interface standard, an Integrated Drive Electronics (IDE) standard, or other suitable standards. The connecting interface unit 102 is packaged with the memory controller 104 in a chip. Or, the connecting interface unit 102 is disposed outside a chip containing the memory controller 104.

The memory controller 104 is configured to execute a plurality of logic gates or control commands implemented in a hardware form or in a firmware form, and to perform operations such as data writing, data reading and data erasing in the rewritable non-volatile memory module 106 according to the commands of the host system 1000.

The rewritable non-volatile memory module 106 is coupled to the memory controller 104 and is configured to store the data written by the host system 1000. The rewritable non-volatile memory module 106 includes physical erasing units 304(0)-304(R). For instance, the physical erasing units 304(0)-304(R) may belong to the same memory die or different memory dies. Each physical erasing unit has a plurality of physical programming units, and the physical programming units that belong to the same physical erasing unit may be written independently and be erased simultaneously. For instance, each physical erasing unit consists of 128 physical programming units. However, it should be understood that the invention is not limited thereto. Each physical erasing unit may consist of 64, 256, or any other number of physical programming units.

More specifically, each physical erasing unit includes a plurality of word lines and a plurality of bit lines, and a memory cell is disposed at the intersection of each word line and bit line. Each memory cell stores one or more bits. In the same physical erasing unit, all memory cells are erased simultaneously. In the present exemplary embodiment, physical erasing unit is the smallest unit for erasing. That is to say, each physical erasing unit has a minimum number of memory cells for being erased altogether. For instance, a physical erasing unit is a physical block. In addition, the memory cells on the same word line compose one or more physical programming units. If each memory cell stores two or more bits, the physical programming units on the same word line are classified into lower physical programming units and upper physical programming units. Generally speaking, a write-in speed of the lower physical programming units is faster than that of the upper physical programming units. In the present exemplary embodiment, physical programming unit is the smallest unit for programming. That is to say, physical programming unit is the smallest unit for writing data. For instance, a physical programming unit is a physical page or physical sector. In the event that the physical programming unit is a physical page, each physical programming unit normally includes a data bit area and a redundant bit area. The data bit area includes a plurality of physical sectors and is configured to store user data, while the redundant bit area is configured to store system data (e.g. an error checking and correcting (ECC) code). In the present exemplary embodiment, each data bit area includes 32 physical sectors with each physical sector being 512 bytes (B). However, in other exemplary embodiments, one data bit area may include 8, 16, or more or fewer physical sectors. The invention does not limit the size or number of the physical sectors.

In the present exemplary embodiment, the rewritable non-volatile memory module 106 is a multi-level cell (MLC) NAND flash memory module. That is, one memory cell stores at least two bits. However, the invention is not limited thereto. The rewritable non-volatile memory module 106 may also be a single-level cell (SLC) NAND flash memory module, a trinary-level cell (TLC) NAND flash memory module, any other type of flash memory module, or any other memory module having the same characteristics.

Figure 3:
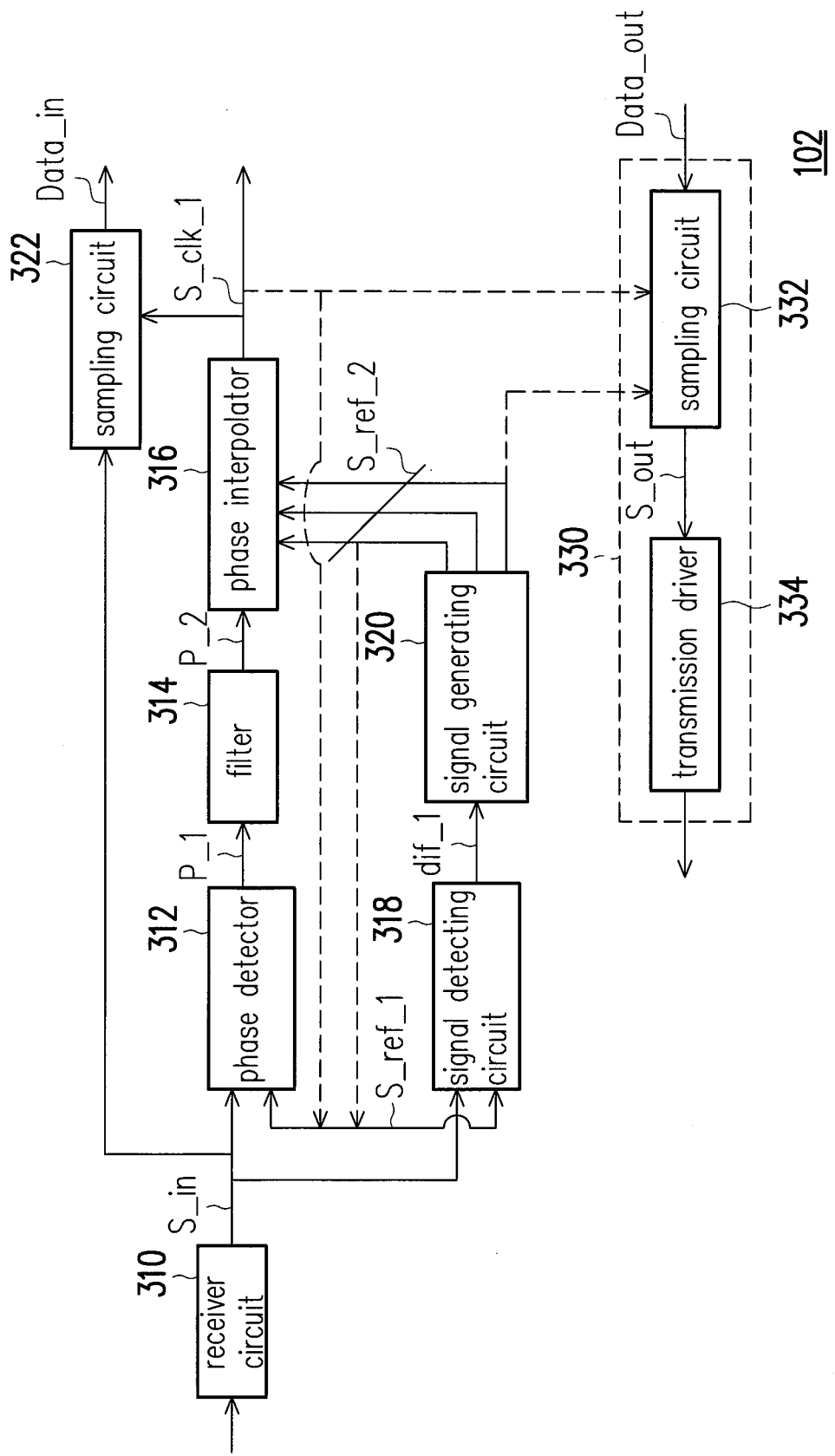
FIG. 3 is a partial block diagram of a connecting interface unit according to the first exemplary embodiment.

FIG. 3 is a partial block diagram of a connecting interface unit according to the first exemplary embodiment.

Referring to FIG. 3, the connecting interface unit 102 at least includes the receiver circuit 310, a phase detector 312, a filter 314, a phase interpolator 316, the signal detecting circuit 318, a signal generating circuit 320, a sampling circuit 322, and a transmitter circuit 330. It is worth noting that the connecting interface unit 102 may include other circuits but not include a crystal oscillator.

In the present exemplary embodiment, the receiver circuit 310 is an equalizer. Nonetheless, the receiver circuit 310 may also be a limiting amplifier, a transimpedance amplifier, or any other circuit for receiving signals from the host system 1000. The invention is not limited thereto. In addition, the receiver circuit 310 performs treatments such as compensation or filtering on an input signal.

The transmitter circuit 330 is, for example, a current-mode logic (CML) transmitter, a low-voltage differential signaling (LVDS) transmitter, or any other signal transmitting circuit for transmitting signals to other devices.

A signal transmitted by the host system 1000 becomes an input signal S_in after passing through the receiver circuit 310. The input signal S_in is received by the phase detector 312, and the phase detector 312 detects a phase difference between the input signal S_in and a first reference signal S_ref_1 to generate a first phase signal P_1. For instance, the first phase signal P_1 serves to indicate that the input signal S_in leads or lags behind the first reference signal S_ref_1. In particular, the phase detector 312 does not couple to a crystal oscillator in an exemplary embodiment of the invention. The filter 314 is coupled to the phase detector 312 and is configured to filter the first phase signal P_1 to generate a second phase signal P_2, and to transmit the second phase signal P_2 to the phase interpolator 316. For instance, the filter 314 is a low-pass filter or a band-pass filter.

The signal detecting circuit 318 receives the input signal S_in, and detects a signal character difference between the input signal S_in and the first reference signal S_ref_1 to generate a first difference signal dif_1. The signal character difference may be a frequency difference or a phase difference. The signal detecting circuit 318 may include a frequency detector, a phase detector, or a phase frequency detector (PFD). The signal generating circuit 320 is coupled to the signal detecting circuit 318, and generates a plurality of second reference signals S_ref_2 according to the first difference signal dif_1. Each second reference signal S_ref_2 has a phase, and the phases of the second reference signals S_ref_2 are different from each other. For instance, in a full-rate design, a number of the second reference signals S_ref_2 is four, and the phases of the second reference signals S_ref_2 are respectively 0, 90, 180 and 270 degrees. Or, in a half-rate design, the number of the second reference signals S_ref_2 is four, and the phases of the second reference signals S_ref_2 are respectively 0, 45, 90 and 135 degrees. The signal generating circuit 320 may also adopt a quarter-rate design or other similar designs. The invention does not limit the number or phase of the second reference signal S_ref_2. In another exemplary embodiment, the number of the second reference signal S_ref_2 is one (i.e. the signal generating circuit 320 only generates the second reference signal S_ref_2 of a certain phase), and the phase interpolator 316 includes a circuit for generating a plurality of signals of different phases according to the second reference signal S_ref_2.

The phase interpolator 316 is coupled to the filter 314 and the signal generating circuit 320, and interpolates a phase between two signals of different phases among the second reference signals S_ref_2 according to the second phase signal P_2, so as to generate a first clock signal S_clk_1. In the above, the first reference signal S_ref_1 is the same as the first clock signal S_clk_1, or the first reference signal S_ref_1 includes at least one of the second reference signal S_ref_2. By transmitting the first clock signal S_clk_1 or the second reference signal S_ref_2 to the phase detector 312 and the signal detecting circuit 318, a frequency of the first clock signal S_clk_1 gradually gets close to a base frequency of the input signal S_in. For instance, the base frequency of the input signal S_in is 5 GHz (gigahertz). After a period of time, the frequency of the first clock signal S_clk_1 is locked at 5 GHz.

The sampling circuit 322 is coupled to the phase interpolator 316, and generates an input data signal Data_in according to the first clock signal S_clk_1. For example, the sampling circuit 322 samples the input signal S_in according to the first clock signal S_clk_1 so as to generate the input data signal Data_in. The input data signal Data_in is, for example, a write-in command, a read command, a written data, or any other command or data issued by the host system 1000. The invention does not limit the content of the input data signal Data_in. It is worth noting that in the present exemplary embodiment, if the host system 1000 is not transmitting data to the memory storage device 100, an amplitude of the input signal S_in does not satisfy a threshold criteria. For example, the threshold criteria indicates that the input signal S_in should be greater than a threshold. The input signal S_in only includes some noise if the amplitude of the input signal S_in is small than the threshold. This threshold is, for example, a numerical value defined by the transmission standard. In other words, if the amplitude of the input signal S_in does not satisfy the threshold criteria, it is determined that the input signal S_in does not include the input data signal Data_in. However, the threshold criteria may includes one or more threshold tests, which is not limited in the invention.

The transmitter circuit 330 modulates an output data signal Data_out according to the first clock signal S_clk_1 or one of the second reference signal S_ref_2 to generate an output signal S_out, and transmits the output signal S_out to the host system 1000. For instance, the transmitter circuit 330 includes a sampling circuit 332 and the transmission driver 334. The sampling circuit 332 modulates the output data signal Data_out, and the transmission driver 334 transmits the output data to the host system 1000. The output data signal Data_out is the data that the memory controller 104 is about to transmit to the host system 1000, and is, for example, the system data or user data stored in the physical erasing units 304(0)-304(R). However, the invention also does not limit the content of the output data signal Data_out. Since the transmitter circuit 330 modulates the output data signal Data_out according to the first clock signal S_clk_1 or one of the second reference signal S_ref_2, there is no need to additionally dispose a crystal oscillator in the transmitter circuit 330 for obtaining a precise base frequency. And, the sampling circuit 332 does not receive a reference clock from a crystal oscillator.

Figure 4:
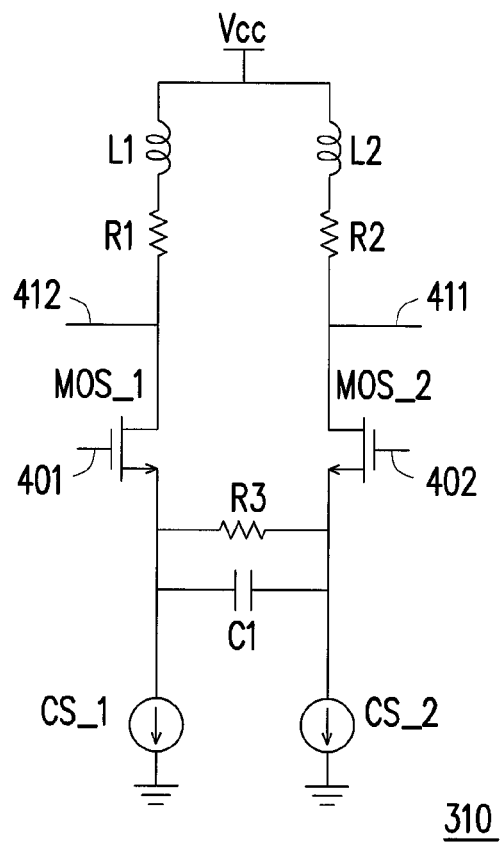
FIG. 4 is a circuit diagram of a receiver circuit 310 according to the first exemplary embodiment.

FIG. 4 is a circuit diagram of the receiver circuit 310 according to the first exemplary embodiment. Referring to FIG. 4, the signals from the host system 1000 are input via terminals 401 and 402, wherein a voltage at the terminal 402 is a reference voltage. Specifically, the terminal 401 is coupled to a control terminal of a transistor MOS_1. A first terminal (drain terminal) of the transistor MOS_1 is coupled to a first terminal of a resistor R1. A second terminal of the resistor R1 is coupled to a second terminal of an inductor L1. A first terminal of the inductor L1 is coupled to a system voltage Vcc. A second terminal (source terminal) of the transistor MOS_1 is coupled to a first terminal of a resistor R3, a first terminal of a capacitor C1, and a current source CS_1. The terminal 402 is coupled to a control terminal of a transistor MOS_2. A first terminal (drain terminal) of the transistor MOS_2 is coupled to a second terminal of a resistor R2. A first terminal of the resistor R2 is coupled to a second terminal of an inductor L2. A first terminal of the inductor L2 is coupled to the system voltage Vcc. A second terminal (source terminal) of the transistor MOS_2 is coupled to a second terminal of the resistor R3, a second terminal of the capacitor C1, and a current source CS_2. A potential difference between terminals 412 and 411 form the input signal S_in, wherein a voltage at the terminal 412 is a reference voltage. In an exemplary embodiment, the receiver circuit 310 is configured to adjust an input impedance.

Figure 5:
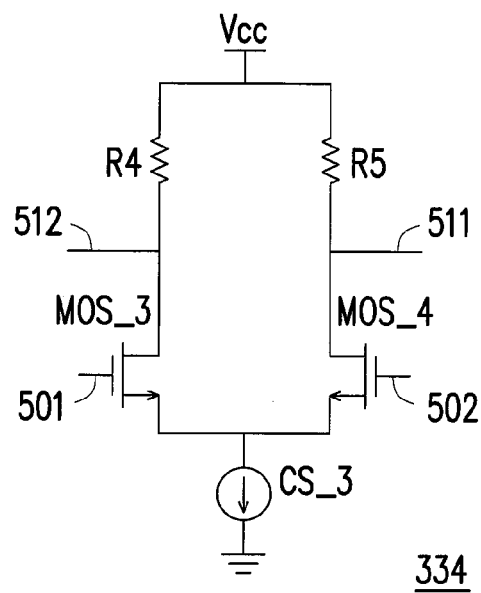
FIG. 5 is a circuit diagram of a transmission driver 334 according to the first exemplary embodiment.

FIG. 5 is a circuit diagram of the transmission driver 334 according to the first exemplary embodiment. Referring to FIG. 5, the output data signal Data_out is input via terminals 501 and 502, wherein a voltage at the terminal 502 is a reference voltage. The terminal 501 is coupled to a control terminal of a transistor MOS_3. A second terminal (source terminal) of the transistor MOS_3 is coupled to a current source CS_3. A first terminal (drain terminal) of the transistor MOS_3 is coupled to a second terminal of a resistor R4. A first terminal of the resistor R4 is coupled to the system voltage Vcc. The terminal 502 is coupled to a control terminal of a transistor MOS_4. A second terminal (source terminal) of the transistor MOS_4 is coupled to the current source CS_3. A first terminal (drain terminal) of the transistor MOS_4 is coupled to a second terminal of a resistor R5. A first terminal of the resistor R5 is coupled to the system voltage Vcc. A potential difference between terminals 511 and 512 form the output signal S_out transmitted to the host system 1000, wherein a voltage at the terminal 512 is a reference voltage. In an exemplary embodiment, the transmission driver 334 is configured to change a level of the output signal S_out without changing the phase or frequency of the output signal S_out.

Second Exemplary Embodiment

Figure 6:
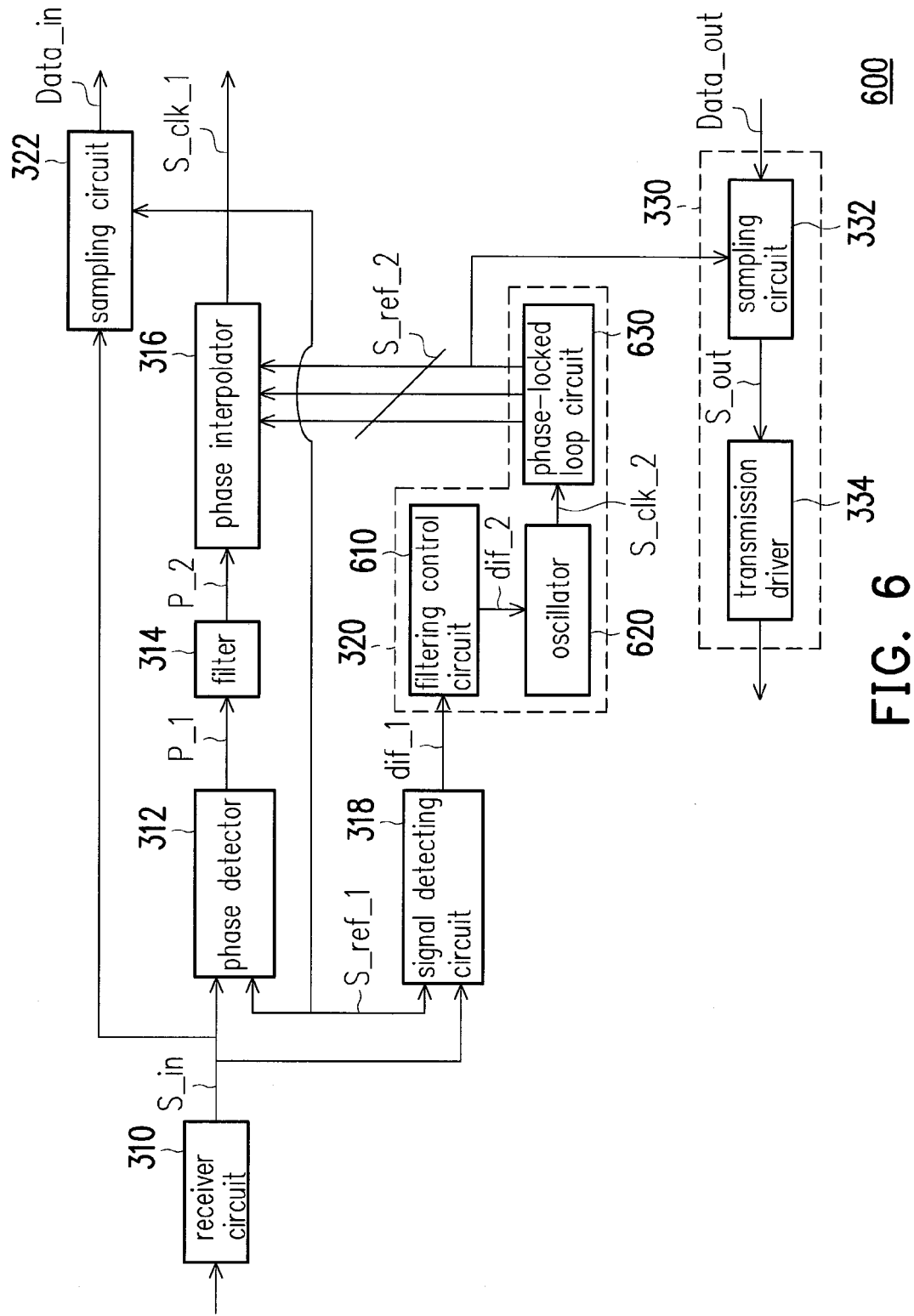
FIG. 6 is a partial block diagram of a connecting interface unit according to the second exemplary embodiment.

FIG. 6 is a partial block diagram of a connecting interface unit according to the second exemplary embodiment.

Referring to FIG. 6, elements of a connecting interface unit 600 are partially the same as those of the connecting interface unit 102 in FIG. 3. In the second exemplary embodiment, the signal generating circuit 320 in the connecting interface unit 600 includes a filtering control circuit 610, an oscillator 620 and a phase-locked loop circuit 630. The first reference signal S_ref_1 is the same as the first clock signal S_clk_1. The transmitter circuit 330 modulates the output data signal Data_out according to one of the second reference signal S_ref_2 to generate the output signal S_out.

The filtering control circuit 610 is coupled to the signal detecting circuit 318 and is configured to filter the first difference signal dif_1 to generate a second difference signal dif_2. For instance, the filtering control circuit 610 may include a low-pass filter. The oscillator 620 is coupled to the filtering control circuit 610 and is configured to generate a second clock signal S_clk_2 according to the second difference signal dif_2. In the present exemplary embodiment, the oscillator 620 is a digital oscillator. However, in other exemplary embodiments, the oscillator 620 may be a voltage-controlled oscillator, or any other non-crystal oscillator such as a Hartley oscillator, a Colpitts oscillator, a Clapp oscillator, a phase-shift oscillator, an RC oscillator, or an LC oscillator. The phase-locked loop circuit 630 is coupled to the oscillator 620, and generates the second reference signal S_ref_2 according to the second clock signal S_clk_2. The phase-locked loop circuit 630 is configured to eliminate jitter of the second clock signal S_clk_2 or to increase the frequency of the second clock signal S_clk_2. For instance, the frequency of the second clock signal S_clk_2 is 25 MHz (megahertz), and the frequency of the second reference signal S_ref_2 is 5 GHz.

In an exemplary embodiment, when the amplitude of the input signal S_in satisfies a threshold criteria (i.e. the host system 1000 is transmitting data to the memory storage device 100), the filtering control circuit 610 stores an oscillation information of the second difference signal dif_2. When the amplitude of the input signal S_in does not satisfy the threshold criteria, the filtering control circuit 610 provides the stored oscillation information. Accordingly, the signal generating circuit 320 generates the second reference signal S_ref_2 according to the oscillation information. For instance, in a case where the oscillator 620 is a voltage-controlled oscillator, the oscillation information is a level of the second difference signal dif_2, and the filtering control circuit 610 includes a capacitor for storing the level. In a case where the oscillator 620 is a digital oscillator, the filtering control circuit 610 includes an analog-to-digital converter and a memory, so as to convert the second difference signal dif_2 into a code and store the code in the memory. The code is exactly the aforementioned oscillation information, and the oscillator 620 oscillates according to the code. When the amplitude of the input signal S_in does not satisfy the threshold criteria, the filtering control circuit 610 does not generate the second difference signal dif_2 according to the first difference signal dif_1. Instead, the filtering control circuit 610 uses the stored level or code as the second difference signal dif_2. That is to say, the oscillator 620 generates the second clock signal S_clk_2 according to the level or code stored in the filtering control circuit 610. In this way, even if the host system 1000 is not transmitting data to the memory storage device 100, the connecting interface unit 600 still generates the second reference signal S_ref_2 at a specific frequency (e.g. 5 GHz) for the transmitter circuit 330. Accordingly, the transmitter circuit 330 modulates the output data signal Data_out and transmits the output signal S_out to the host system 1000.

Third Exemplary Embodiment

Figure 7:
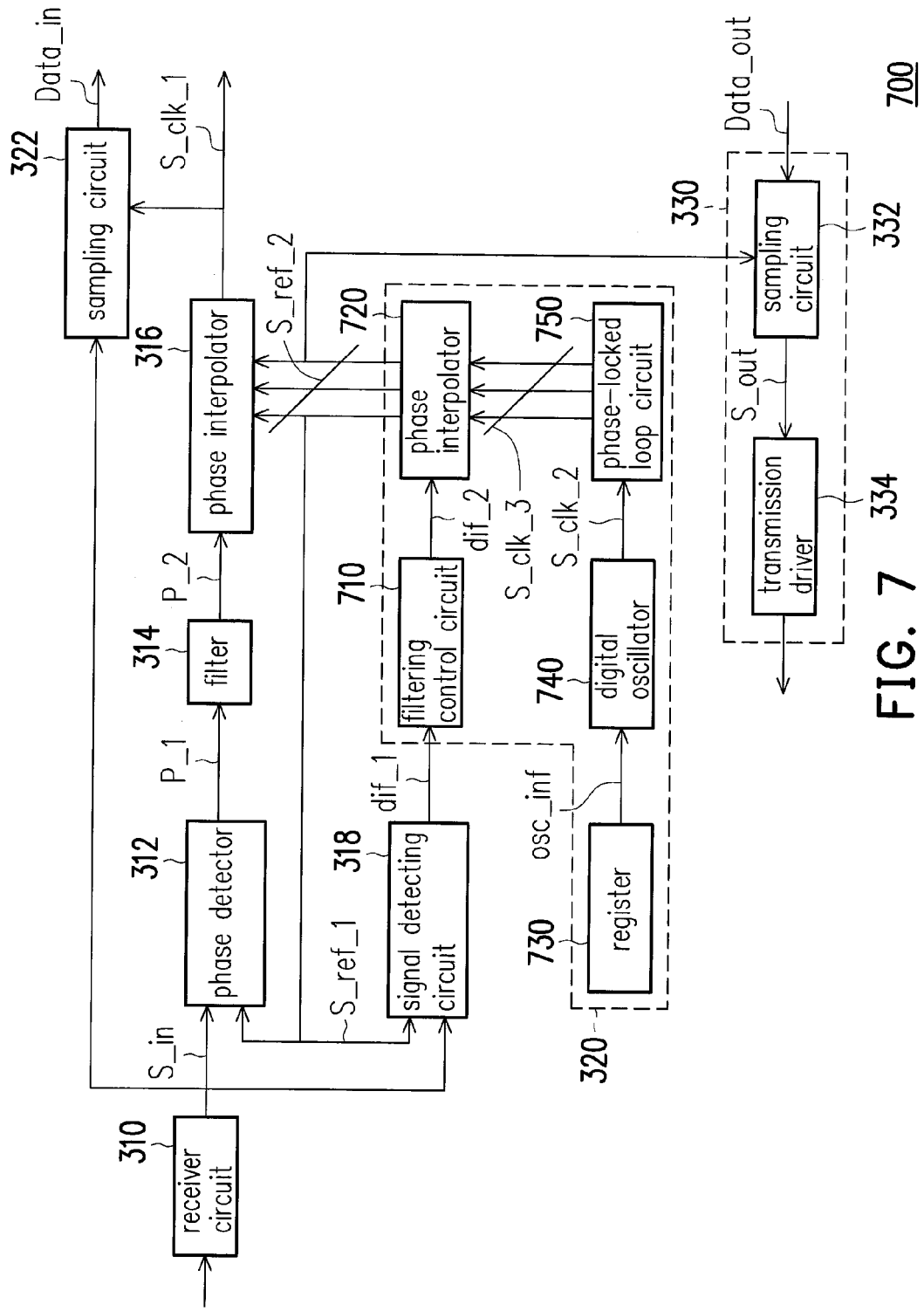
FIG. 7 is a partial block diagram of a connecting interface unit according to the third exemplary embodiment.

FIG. 7 is a partial block diagram of a connecting interface unit according to the third exemplary embodiment.

Referring to FIG. 7, elements of a connecting interface unit 700 are partially the same as those of the connecting interface unit 102 in FIG. 3. In the third exemplary embodiment, the signal generating circuit 320 includes a filtering control circuit 710, a phase interpolator 720 (i.e. second phase interpolator), a register 730, a digital oscillator 740 and a phase-locked loop circuit 750.

In the present exemplary embodiment, the number of the second reference signal S_ref_2 is greater than one, and all the second reference signals S_ref_2 are transmitted to the phase detector 312 and the signal detecting circuit 318 via a plurality of lines so as to serve as the first reference signal S_ref_1. However, in another exemplary embodiment, the number of the second reference signal S_ref_2 is equal to one, and this second reference signal S_ref_2 is transmitted to the phase detector 312 and the signal detecting circuit 318 via one line. Moreover, the phase detector 312 and the signal detecting circuit 318 both include a circuit for generating a plurality of signals of different phases according to the second reference signal S_ref_2. Or, the number of the second reference signal S_ref_2 is greater than one, but only one of the second reference signals S_ref_2 is transmitted to the phase detector 312 and the signal detecting circuit 318; and the circuits in the phase detector 312 and the signal detecting circuit 318 generate a plurality of signals of different phases according to the second reference signal S_ref_2. In other words, the first reference signal S_ref_1 includes at least one of the second reference signal S_ref_2. In addition, in the third exemplary embodiment, the transmitter circuit 330 modulates the output data signal Data_out according to one of the second reference signal S_ref_2 to generate the output signal S_out.

The filtering control circuit 710 filters the first difference signal dif_1 to generate the second difference signal dif_2. When the amplitude of the input signal S_in satisfies the threshold criteria, the filtering control circuit 710 stores the oscillation information of the second difference signal dif_2. When the amplitude of the input signal S_in does not satisfy the threshold criteria, the filtering control circuit 710 provides the stored oscillation information. Details of this operation have been described above and thus are not repeated here.

The register 730 provides an initial oscillation information osc_inf to the digital oscillator 740. The digital oscillator 740 oscillates according to the initial oscillation information osc_inf to generate the second clock signal S_clk_2. For instance, a manufacturer of the connecting interface unit 700 may adjust the initial oscillation information osc_inf at a test stage, so that the digital oscillator 740 generates a clock signal at a specific frequency (e.g. 5 GHz). Due to variables in temperature or manufacturing processes, different digital oscillators 740 correspond respectively to different initial oscillation information osc_inf, and the manufacturer stores the corresponding initial oscillation information osc_inf in the register 730. There may be a small deviation in the frequency of the second clock signal S_clk_2 generated by the digital oscillator 740. For instance, in the event that the aforementioned specific frequency is 5 GHz, the frequency of the second clock signal S_clk_2 may be greater than or less than 5 GHz.

The phase-locked loop circuit 750 is coupled to the digital oscillator 740, and is configured to generate a plurality of third clock signals S_clk_3 according to the second clock signal S_clk_2, wherein phases of the third clock signals S_clk_3 are different from each other. For instance, the phase-locked loop circuit 750 may be used to reduce the jitter of the second clock signal S_clk_2. The phase interpolator 720 (i.e. the second phase interpolator) generates the second reference signal S_ref_2 according to the second difference signal dif_2 and the third clock signals S_clk_3. In this way, the frequency of the second reference signal S_ref_2 is close to the base frequency (e.g. GHz) of the input signal S_in.

Fourth Exemplary Embodiment

Figure 8:
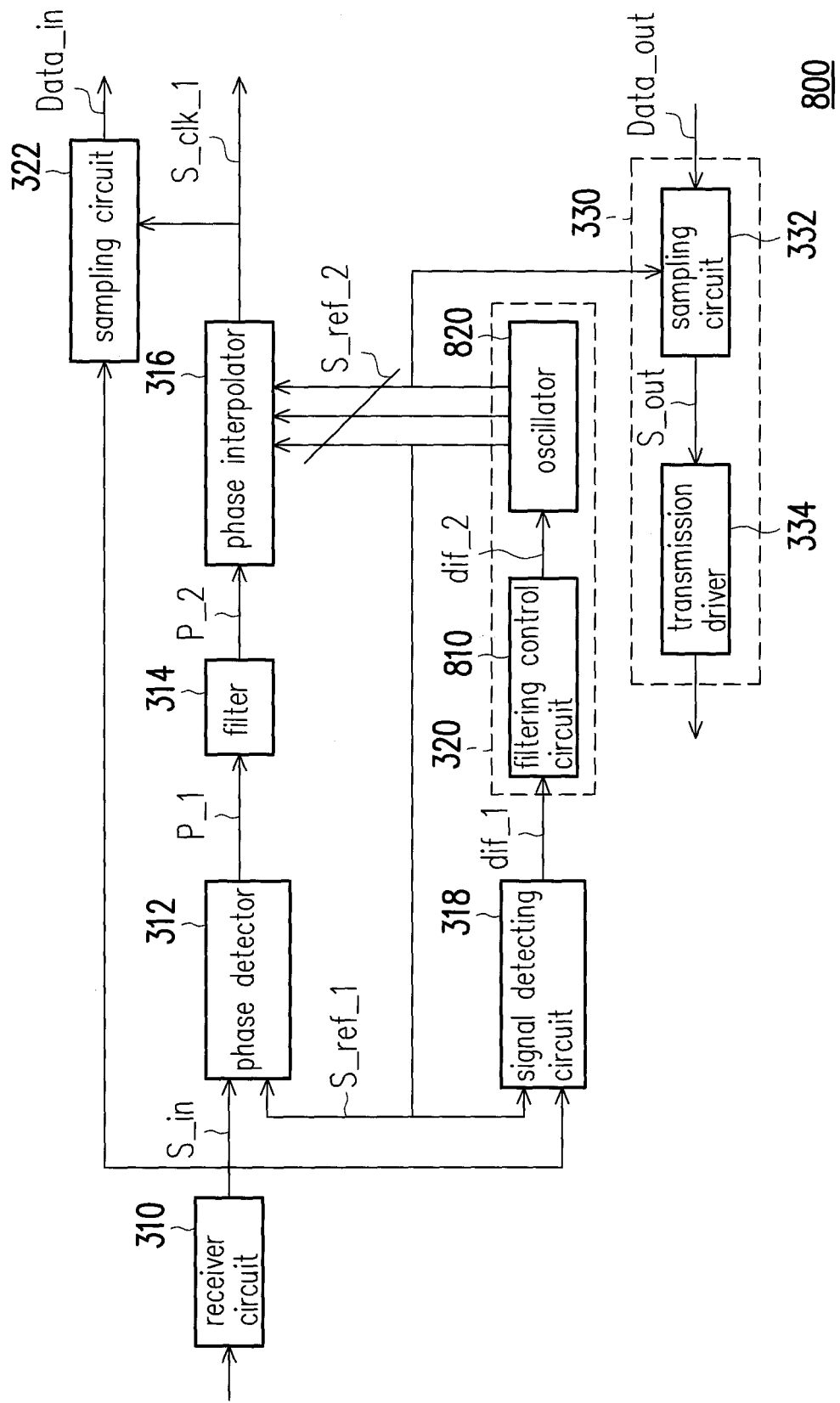
FIG. 8 is a partial block diagram of a connecting interface unit according to the fourth exemplary embodiment.

FIG. 8 is a partial block diagram of a connecting interface unit according to the fourth exemplary embodiment.

Referring to FIG. 8, elements of a connecting interface unit 800 are partially the same as those of the connecting interface unit 102 in FIG. 3. In the fourth exemplary embodiment, the signal generating circuit 320 includes a filtering control circuit 810 and an oscillator 820. The first reference signal S_ref_1 includes at least one of the second reference signal S_ref_2. The transmitter circuit 330 modulates the output data signal Data_out according to one of the second reference signal S_ref_2.

The filtering control circuit 810 is configured to filter the first difference signal dif_1 to generate the second difference signal dif_2. When the amplitude of the input signal S_in satisfies the threshold criteria, the filtering control circuit 810 stores the oscillation information of the second difference signal dif_2. When the amplitude of the input signal S_in does not satisfy the threshold criteria, the filtering control circuit 810 provides the stored oscillation information. Details of this operation have been described above and thus are not repeated here.

The oscillator 820 is coupled to the filtering control circuit 810 and is configured to generate the second reference signal S_ref_2 according to the second difference signal dif_2. In the present exemplary embodiment, the oscillator 820 is an LC oscillator. The signal detecting circuit 318 includes the frequency detector. The first difference signal dif_1 is a frequency difference between the input signal S_in and the first reference signal S_ref_1. Thus, the frequency of the second reference signal S_ref_2 is locked at the frequency of the input signal S_in. However, in other exemplary embodiments, the oscillator 820 may be any other non-crystal oscillator. The invention is not limited thereto.

It is worth mentioning that the host system 1000 may perform a spread spectrum (SS) operation on the input signal S_in. That is to say, the frequency of the input signal S_in varies within a specified range with time, so that signal energy is distributed in a frequency band, thereby inhibiting electromagnetic interference (EMI) of the signals. A spread spectrum range is, for example, 0-±5000 ppm (parts per million). However, in the event that the input signal S_in has been subjected to the spread spectrum operation, according to a bandwidth of a loop formed by the signal detecting circuit 318, the filtering control circuit 810 and the oscillator 820, the frequency of the second reference signal S_ref_2 may vary within a specified range with time as well. Specifically, if the bandwidth of the loop formed by the signal detecting circuit 318, the filtering control circuit 810 and the oscillator 820 is smaller than a bandwidth of the spread spectrum operation, influence of the spread spectrum operation is eliminated. On the contrary, if the bandwidth of the loop is equal to or greater than the bandwidth of the spread spectrum operation, the influence of the spread spectrum operation is retained (i.e. the frequency of the second reference signal S_ref_2 varies within a specified range with time). However, designers may design the bandwidth of the loop depending on different needs. The invention does not limit the bandwidth of the loop.

Fifth Exemplary Embodiment

Figure 9:
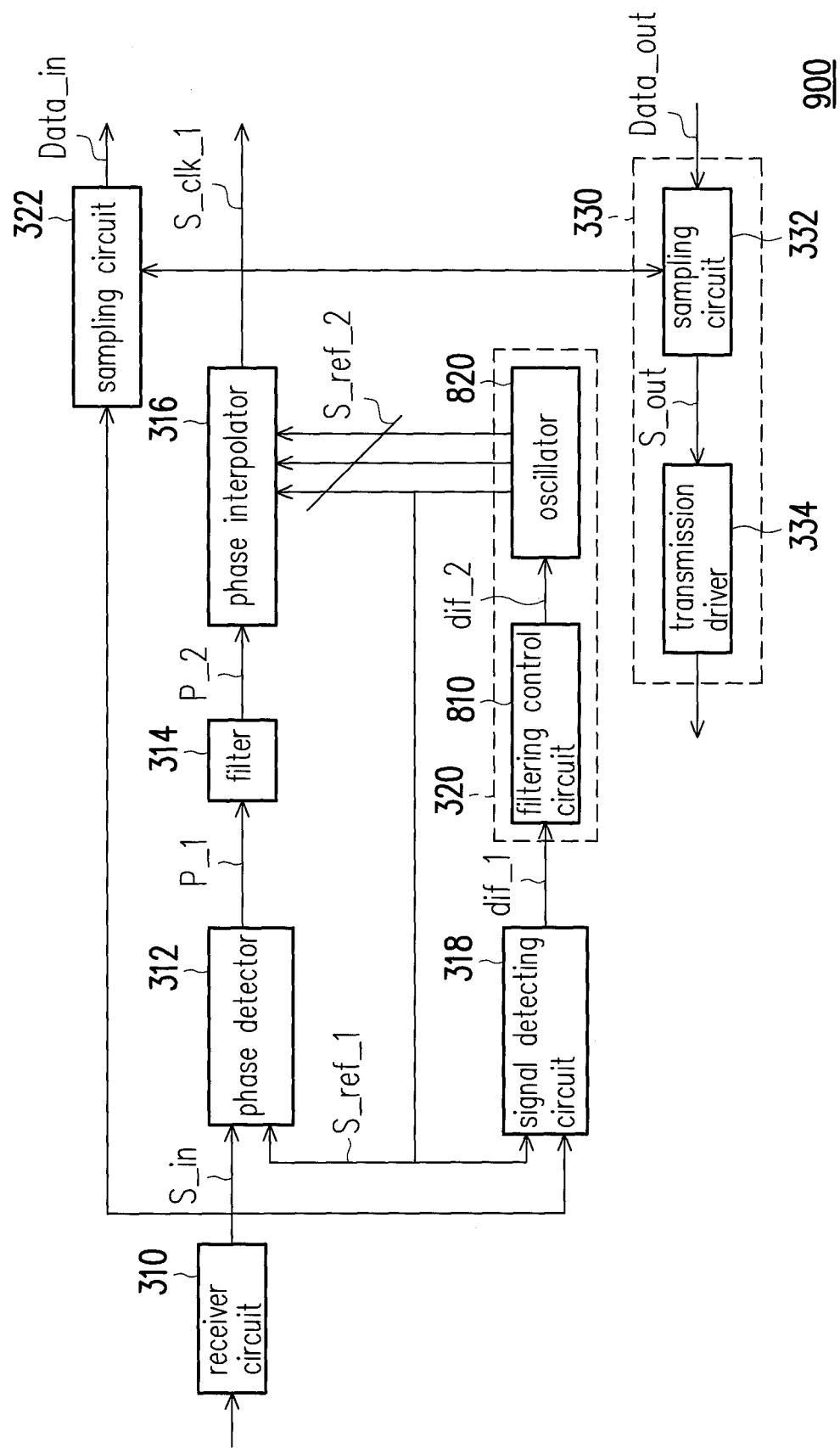
FIG. 9 is a partial block diagram of a connecting interface unit according to the fifth exemplary embodiment.

FIG. 9 is a partial block diagram of a connecting interface unit according to the fifth exemplary embodiment.

Referring to FIG. 9, elements of a connecting interface unit 900 are partially the same as those of the connecting interface unit 800 in FIG. 8. In the fifth exemplary embodiment, the first reference signal S_ref_1 includes at least one of the second reference signal S_ref_2. The transmitter circuit 330 modulates the output data signal Data_out according to the first clock signal S_clk_1.

In the present exemplary embodiment, the input signal S_in has been subjected to a spread spectrum operation (also referred as first spread spectrum operation). The bandwidth of the loop formed by the signal detecting circuit 318, the filtering control circuit 810 and the oscillator 820 is smaller than the bandwidth of the first spread spectrum operation. Accordingly, the noise in the second reference signal S_ref_2 is eliminated, and the second reference signal S_ref_2 does not show a spread spectrum effect. However, a bandwidth of a loop formed by the phase detector 312, the filter 314 and the phase interpolator 316 is equal to or greater than the bandwidth of the first spread spectrum operation. Accordingly, the effect of the first spread spectrum operation is retained by the first clock signal S_clk_1. Since the transmitter circuit 330 modulates the output data signal Data_out according to the first clock signal S_clk_1, the output signal S_out shows the effect of the first spread spectrum operation as well (i.e. the frequency of the output signal S_out varies within a specified range with time).

Sixth Exemplary Embodiment

Figure 10:
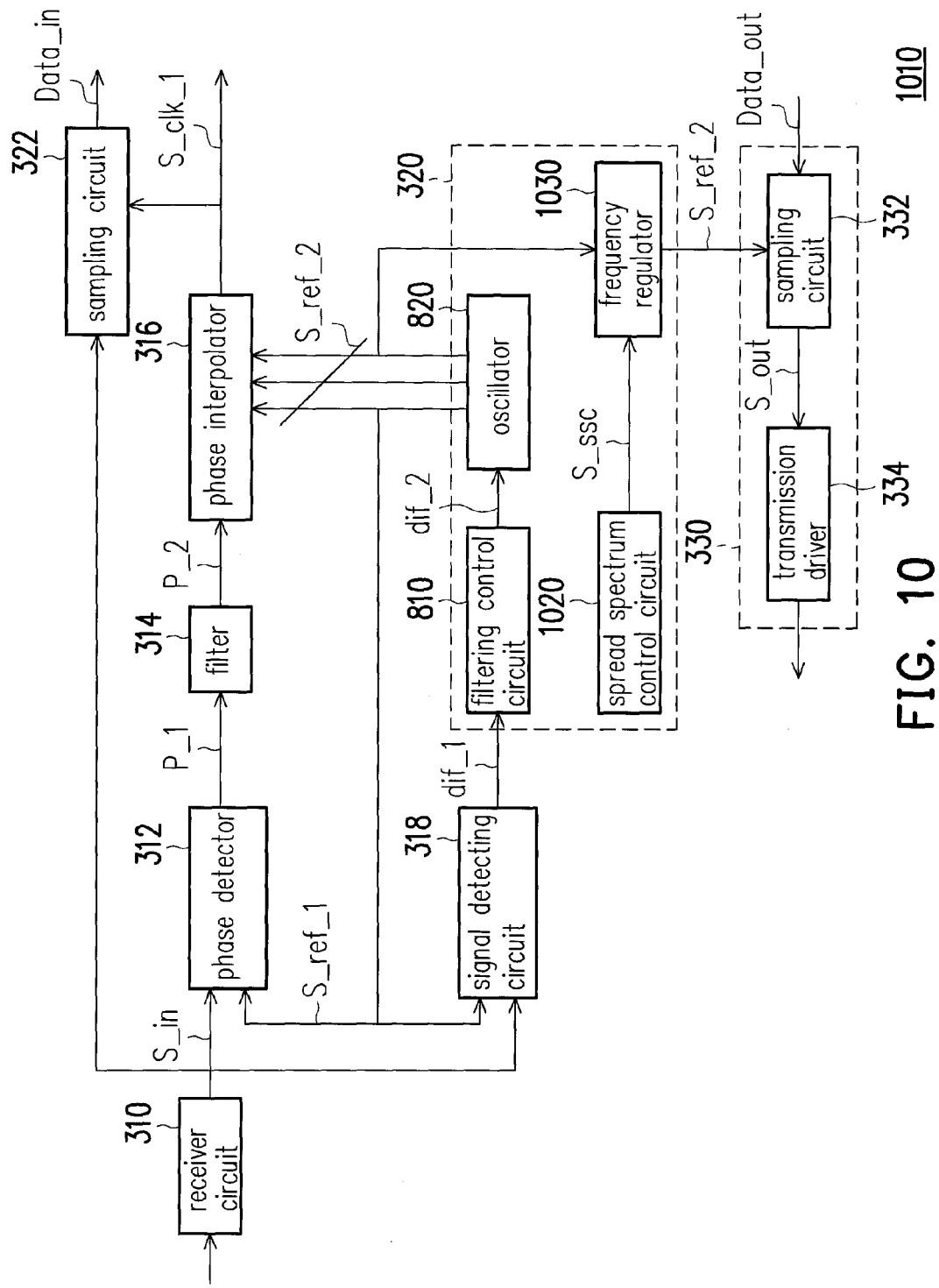
FIG. 10 is a partial block diagram of a connecting interface unit according to the sixth exemplary embodiment.

FIG. 10 is a partial block diagram of a connecting interface unit according to the sixth exemplary embodiment.

Referring to FIG. 10, a connecting interface unit 1010 includes all the elements of the connecting interface unit 800 in FIG. 8. A difference lies in that the signal generating circuit 320 in FIG. 10 further includes a spread spectrum control circuit 1020 and a frequency regulator 1030.

In the sixth exemplary embodiment, the input signal S_in has been subjected to a spread spectrum operation (also referred as the first spread spectrum operation). The bandwidth of the loop formed by the signal detecting circuit 318, the filtering control circuit 810 and the oscillator 820 is smaller than the bandwidth of the first spread spectrum operation. Accordingly, the noise in the second reference signal S_ref_2 is eliminated, and the second reference signal S_ref_2 does not show a spread spectrum effect. However, the spread spectrum control circuit 1020 provides a spread spectrum signal S_ssc, and the spread spectrum signal S_ssc may be a square-wave signal, a triangular-wave signal, or a signal of any waveform. The frequency regulator 1030 performs a spread spectrum operation (also referred as second spread spectrum operation) on one of the second reference signal S_ref_2 according to the spread spectrum signal S_ssc. The sampling circuit 332 modulates the output data signal Data_out according to the second reference signal S_ref_2 that has been subjected to the second spread spectrum operation. Accordingly, the output signal S_out shows the spread spectrum effect as well. In the present exemplary embodiment, the frequency regulator 1030 may be a phase interpolator or a frequency divider/multiplier. The invention is not limited thereto.

In the present exemplary embodiment, the oscillator 820 generates the second reference signals S_ref_2 of a plurality of phases. However, in another exemplary embodiment, the oscillator 820 generates only one second reference signal S_ref_2, and the phase interpolator 316, the phase detector 312 and the signal detecting circuit 318 generate a plurality of phases according to the second reference signal S_ref_2. For instance, the phase interpolator 316, the phase detector 312 and the signal detecting circuit 318 may further include a delay buffer. In this way, the second reference signals S_ref_2 of different phases are prevented from being transmitted a long distance, or the design of the oscillator 820 is simplified.

Figure 11:
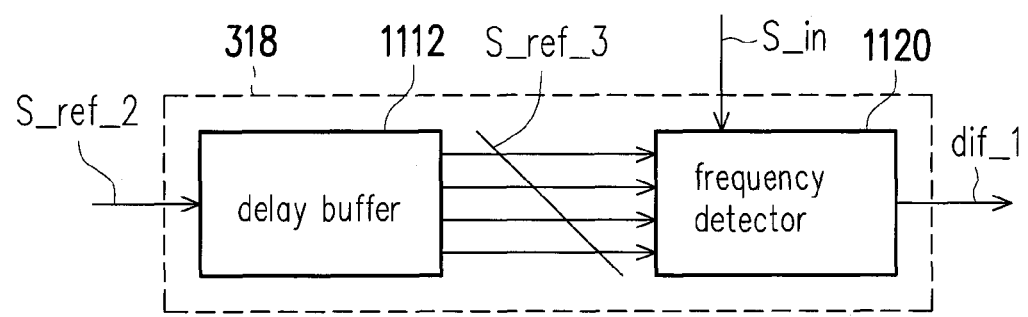
FIG. 11 is a partial block diagram of a signal detecting circuit 318 according to an exemplary embodiment of the invention.

FIG. 11 is a partial block diagram of the signal detecting circuit 318 according to an exemplary embodiment of the invention.

Referring to FIG. 11, in an exemplary embodiment, the signal detecting circuit 318 includes a delay buffer 1112 and a frequency detector 1120. The delay buffer 1112 delays the second reference signal S_ref_2 to generate a plurality of third reference signals S_ref_3. Phases of the third reference signals S_ref_3 are different from each other. For instance, the differences between the phases are less than 45 degrees and greater than 0 degree. The frequency detector 1120 detects a frequency difference between the third reference signal S_ref_3 and the input signal S_in (for example, determines whether each third reference signal S_ref_3 leads or lags behind the input signal S_in), thereby generating the first difference signal dif_1. Referring to FIG. 10 and FIG. 11, a delay buffer may be additionally disposed in the phase detector 312 and the phase interpolator 316, thereby generating a plurality of phases. The delay buffer in the phase detector 312 and the phase interpolator 316 is similar to the delay buffer 1112 in the signal detecting circuit 318, and thus is not described repeatedly. In addition, the configuration of the delay buffer 1112 may also be applied to the exemplary embodiments in FIG. 3 and FIGS. 6 to 9. The invention is not limited thereto.

Seventh Exemplary Embodiment

Figure 12:
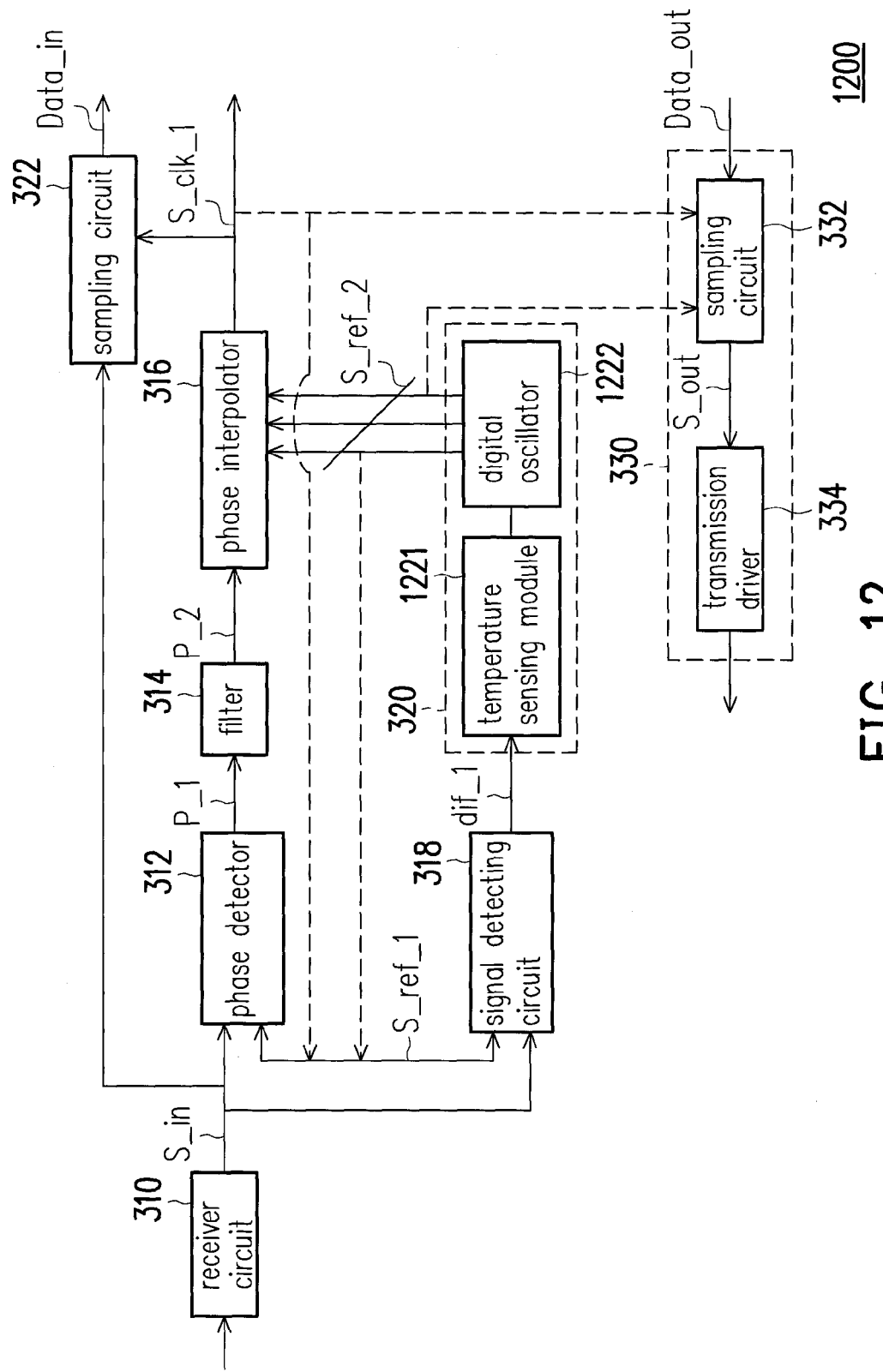
FIG. 12 is a partial block diagram of a connecting interface unit according to the seventh exemplary embodiment.

FIG. 12 is a partial block diagram of a connecting interface unit according to the seventh exemplary embodiment. Referring to FIG. 12, a connecting interface unit 1200 includes all the elements of the connecting interface unit 102 in FIG. 3. A difference lies in that in the seventh exemplary embodiment, the signal generating circuit 320 includes a temperature sensing module 1221 and a digital oscillator 1222. The temperature sensing module 1221 is coupled to the signal detecting circuit 318 and the digital oscillator 1222 and is configured to receive the first difference signal dif_1. The digital oscillator 1222 is coupled to the phase interpolator 316.

The temperature sensing module 1221 is configured to store the first difference signal dif_1 when the amplitude of the input signal S_in satisfies the threshold criteria, and to provide the stored first difference signal dif_1 to the digital oscillator 1222 when the amplitude of the input signal S_in does not satisfy the threshold criteria. In the present exemplary embodiment, the first difference signal dif_1 is a digital signal. The digital oscillator 1222 regards the first difference signal dif_1 as a code. The codes having different numerical values enable the digital oscillator 1222 to output the second reference signals S_ref_2 at different frequencies. However, when the digital oscillator 1222 varies in temperature, the codes having the same numerical value may generate the second reference signals S_ref_2 at different frequencies. For instance, when the amplitude of the input signal S_in satisfies the threshold criteria, the temperature of the digital oscillator 1222 is 20° C. At this moment, the stored code is "1010," and the frequency of the second reference signal S_ref_2 is 5 GHz. However, when the amplitude of the input signal S_in does not satisfy the threshold criteria, the temperature of the digital oscillator 1222 may be 70° C. At this moment, the code provided to the digital oscillator 1222 is still "1010," but the frequency of the second reference signal S_ref_2 may be less than or greater than 5 GHz.

Thus, in the present exemplary embodiment, when the amplitude of the input signal S_in satisfies the threshold criteria, the temperature sensing module 1221 heats the digital oscillator 1222 and records the codes used for the digital oscillator 1222 to generate the second reference signal S_ref_2 at different temperatures. All the codes are used for generating the second reference signal S_ref_2 at a specific frequency (e.g. 5 GHz), and the codes are in bijection with the temperatures. When the amplitude of the input signal S_in does not satisfy the threshold criteria, the temperature sensing module 1221 detects a current temperature of the digital oscillator 1222, generates a current code according to the current temperature and the recorded codes, and transmits the current code to the digital oscillator 1222. For instance, if the current temperature is one of the recorded temperatures, the temperature sensing module 1221 uses the code to which the current temperature corresponds as the current code. On the contrary, if the current temperature is not one of the recorded temperatures, the temperature sensing module 1221 obtains the current code through interpolation or extrapolation according to the current temperature and the recorded codes. The digital oscillator 1222 oscillates according to the current code to generate the second reference signal S_ref_2. In this way, even if the host system 1000 is not transmitting data to the memory storage device 100 and the digital oscillator 1222 varies in temperature, the digital oscillator 1222 is still able to generate the second reference signal S_ref_2 at the frequency of 5 GHz according to the current code.

Figure 13:
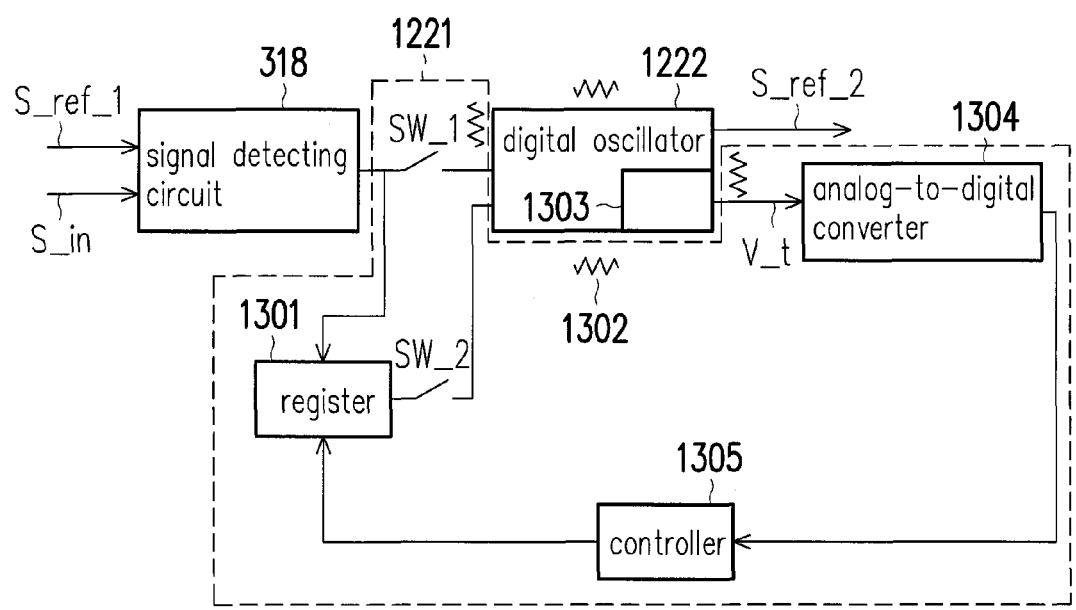
FIG. 13 is a circuit diagram of a temperature sensing module according to the seventh exemplary embodiment.

FIG. 13 is a circuit diagram of a temperature sensing module according to the seventh exemplary embodiment. Referring to FIG. 13, the temperature sensing module 1221 includes a register 1301, a first switch SW_1, a second switch SW_2, a heater 1302, a temperature sensor 1303, an analog-to-digital converter 1304, and a controller 1305. The register 1301 is coupled to the signal detecting circuit 318. The first switch SW_1 is coupled between the signal detecting circuit 318 and the digital oscillator 1222. The second switch SW_2 is coupled between the register 1301 and the digital oscillator 1222. When the amplitude of the input signal S_in satisfies the threshold criteria, the controller 1305 conducts the first switch SW_1 and cuts off the second switch SW_2, so as to transmit the first difference signal dif_1 to the digital oscillator 1222. In addition, the controller 1305 drives the heater 1302 to heat the digital oscillator 1222. The heater 1302 is, for example, a resistor. However, the invention is not limited thereto. The temperature sensor 1303 continuously detects the temperature of the digital oscillator 1222 and outputs a plurality of voltages V_t. For instance, if the temperature of the digital oscillator 1222 is getting higher, the level of the voltage V_t is getting lower. The analog-to-digital converter 1304 converts the voltages V_t that represent temperatures into a plurality of digital data. In such heating process, the controller 1305 obtains a plurality of codes (corresponding to the temperatures) used by the digital oscillator 1222, and stores the codes and the aforementioned digital data in a configuration table in the register 1301.

Figures 14, 15:
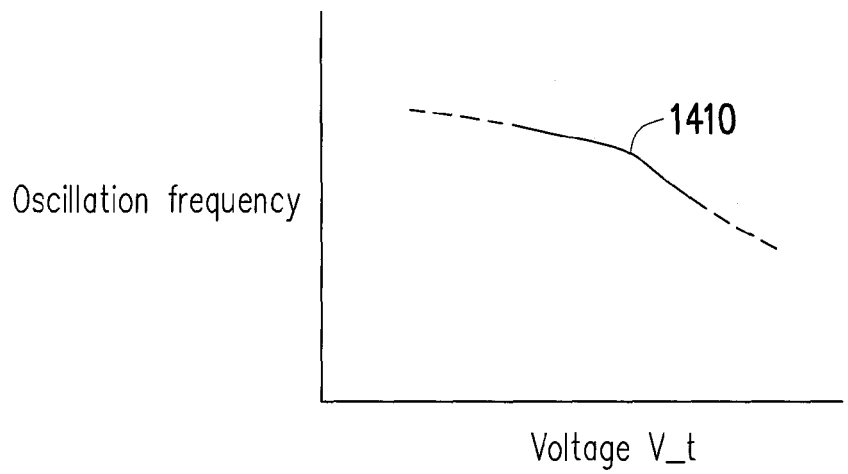
FIG. 14 illustrates a frequency-voltage curve of a digital oscillator according to the seventh exemplary embodiment.
FIG. 15 is a schematic diagram of a configuration table recorded in a register according to the seventh exemplary embodiment.

FIG. 14 illustrates a frequency-voltage curve of a digital oscillator according to the seventh exemplary embodiment. Referring to FIG. 14, in the present exemplary embodiment, the greater the value of the input code is, an oscillation frequency of the digital oscillator 1222 gets greater. When the temperature gets higher (the voltage V_t gets lower), even if the same code is input, the oscillation frequency of the digital oscillator 1222 still increases (as shown by a curve 1410). Thus, when the temperature gets higher, in order to output the second reference signal S_ref_2 at a fixed frequency, the digital oscillator 1222 must use a code having a smaller value. FIG. 15 is a schematic diagram of a configuration table recorded in a register according to the seventh exemplary embodiment. Referring to FIG. 15, when the temperature gets higher (the voltage V_t gets lower), the value of the code recorded in a configuration table 1500 decreases. It is worth noting that the temperatures in FIG. 15 only serve to describe a relationship between the voltages V_t and the codes. The configuration table 1500 does not record exact temperatures.

Referring to both FIG. 13 and FIG. 15, when the amplitude of the input signal S_in does not satisfy the threshold criteria, the controller 1305 cuts off the first switch SW_1 and conducts the second switch SW_2. At this moment, the temperature sensor 1303 detects the current temperature of the digital oscillator 1222 and outputs the voltage V_t. The analog-to-digital converter 1304 converts the voltage V_t that represents the current, temperature into digital data. If the digital data is the same as the digital data recorded in the register 1301, the controller 1305 outputs a corresponding code as the current code. For instance, if the voltage that represents the current temperature is 0.74 V, the controller 1305 outputs a code "10010" to the digital oscillator 1222. However, if the voltage V_t that represents the current temperature is different from the voltages V_t recorded in the register 1301, the controller 1305 generates the current code in an interpolation or extrapolation manner. For instance, if the voltage V_t that represents the current temperature is 0.80 V, the controller 1305 obtains the current code "10040" through extrapolation, and outputs the current code "10040" to the digital oscillator 1222. In the present exemplary embodiment, the controller 1305 obtains the current code through interpolation/extrapolation using a linear algorithm. However, in another exemplary embodiment, the controller 1305 defines a nonlinear function according to the codes and digital data in the configuration table 1500, and calculates the current code using the nonlinear function and the voltage V_t that represents the current temperature.

Figure 16:
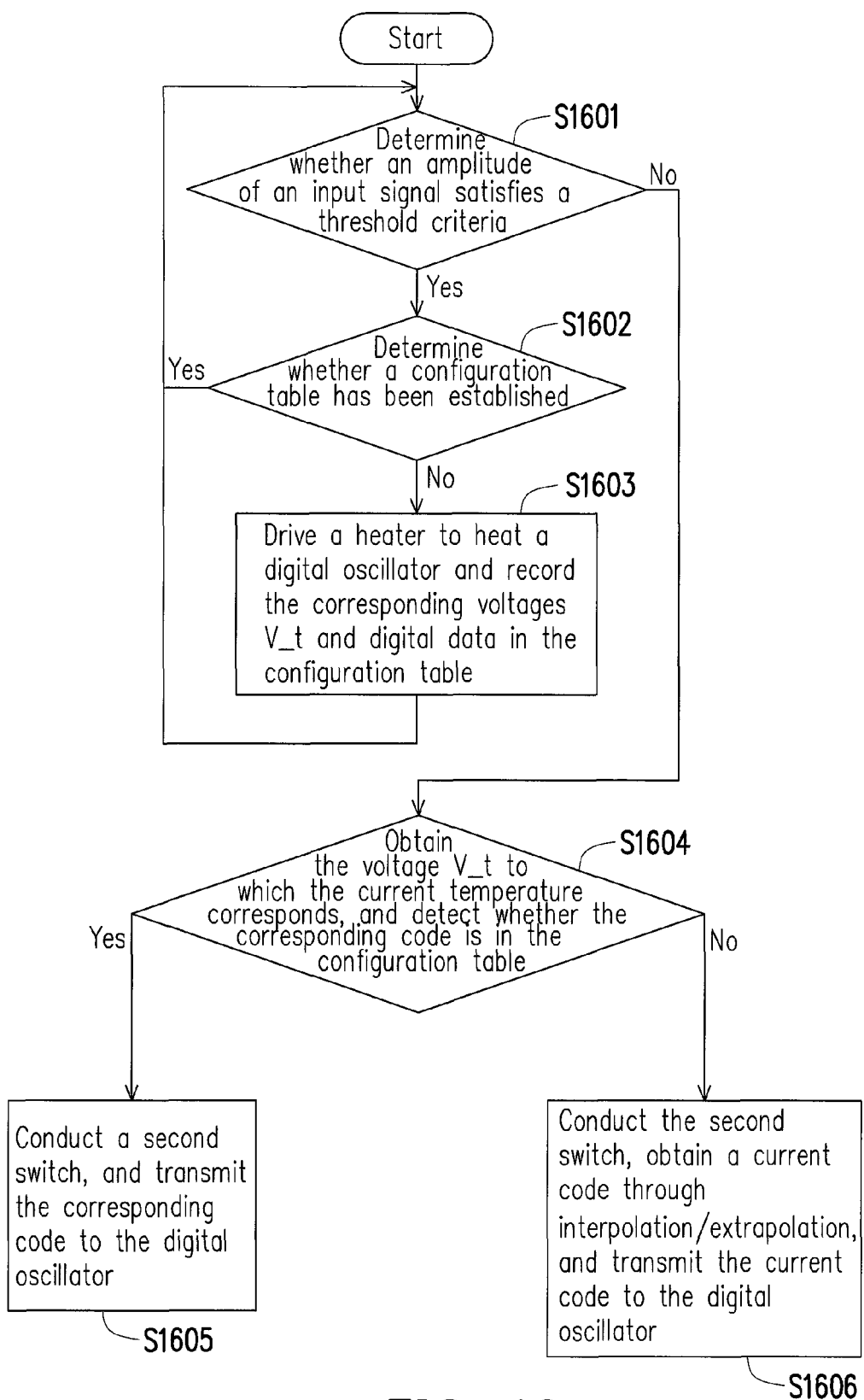
FIG. 16 is an operation flow chart of the temperature sensing module according to the seventh exemplary embodiment.

FIG. 16 is an operation flow chart of the temperature sensing module according to the seventh exemplary embodiment. Referring to FIG. 16, in step S1601, the controller 1305 determines whether the amplitude of the input signal S_in satisfies the threshold criteria. If the amplitude of the input signal S_in satisfies the threshold criteria, in step S1602, the controller 1305 determines whether a configuration table has been established. If the configuration table has been established, the controller 1305 returns to step S1601. If the configuration table has not been established, in step S1603, the controller 1305 drives the heater 1302 to heat the digital oscillator 1222 and records the corresponding voltages V_t and digital data in the configuration table. If the amplitude of the input signal S_in does not satisfy the threshold criteria, in step S1604, the controller 1305 obtains the voltage V_t to which the current temperature corresponds, and detects whether the corresponding code is in the configuration table. If the corresponding code is in the configuration table, in step S1605, the controller 1305 conducts the second switch, and transmits the corresponding code to the digital oscillator 1222. If the corresponding code is not in the configuration table, in step S1606, the controller 1305 conducts the second switch, obtains the current code through interpolation/extrapolation, and transmits the current code to the digital oscillator 1222. The steps in FIG. 16 have been described above and thus are not repeated here.

It is worth noting that the aforementioned exemplary embodiments may be combined with each other. The invention is not limited thereto. For instance, the temperature sensing module 1221 in the seventh exemplary embodiment may be disposed in the connecting interface units in the first to sixth exemplary embodiments.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A connecting interface unit not comprising a crystal oscillator, comprising:
    a phase detector configured to receive an input signal from a host system, and to detect a phase difference between the input signal and a first reference signal to generate a first phase signal;
    a filter coupled to the phase detector and configured to filter the first phase signal to generate a second phase signal;
    a signal detecting circuit configured to receive the input signal, and to detect a signal character difference between the input signal and the first reference signal to generate a first difference signal;
    a signal generating circuit coupled to the signal detecting circuit and configured to generate at least one second reference signal according to the first difference signal;
    a first phase interpolator coupled to the filter and the signal generating circuit and configured to generate a first clock signal according to the second phase signal and the at least one second reference signal;
    a first sampling circuit coupled to the first phase interpolator and configured to generate an input data signal according to the first clock signal; and
    a transmitter circuit, not receiving a reference clock from a crystal oscillator, configured to modulate an output data signal according to the first clock signal or one of the at least one second reference signal to generate an output signal, and to transmit the output signal to the host system.

2. The connecting interface unit of claim 1, wherein the first reference signal is the same as the first clock signal, and the signal generating circuit comprises:
    a filtering control circuit coupled to the signal detecting circuit and configured to filter the first difference signal to generate a second difference signal;
    an oscillator coupled to the filtering control circuit and configured to generate a second clock signal according to the second difference signal;
    a phase-locked loop circuit coupled to the oscillator and configured to generate the at least one second reference signal according to the second clock signal,
    wherein the transmitter circuit is coupled to the phase-locked loop circuit, and modulates the output data signal according to one of the at least one second reference signal.

3. The connecting interface unit of claim 1, wherein the signal generating circuit further comprises:
    a filtering control circuit coupled to the signal detecting circuit and configured to filter the first difference signal to generate a second difference signal,
    wherein the filtering control circuit is configured to store an oscillation information of the second difference signal when an amplitude of the input signal satisfies a threshold criteria,
    wherein the filtering control circuit is configured to provide the oscillation information when the amplitude of the input signal does not satisfy the threshold criteria, and the signal generating circuit is configured to generate the at least one second reference signal according to the oscillation information.

4. The connecting interface unit of claim 1, wherein the first reference signal comprises one of the at least one second reference signal, and the signal generating circuit comprises:
    a filtering control circuit coupled to the signal detecting circuit and configured to filter the first difference signal to generate a second difference signal;
    a register configured to provide an initial oscillation information;
    a digital oscillator configured to oscillate according to the initial oscillation information to generate a second clock signal;
    a phase-locked loop circuit coupled to the digital oscillator and configured to generate a third clock signal according to the second clock signal;

a second phase interpolator coupled to the filtering control circuit and the phase-locked loop circuit and configured to generate the at least one second reference signal according to the second difference signal and the third clock signal, wherein the transmitter circuit modulates the output data signal according to one of the at least one second reference signal.

5. The connecting interface unit of claim 1, wherein the first reference signal comprises one of the at least one second reference signal, and the signal generating circuit comprises:
a filtering control circuit coupled to the signal detecting circuit and configured to filter the first difference signal to generate a second difference signal;
an oscillator coupled to the filtering control circuit and configured to oscillate according to the second difference signal to generate the at least one second reference signal,
wherein the transmitter circuit modulates the output data signal according to one of the at least one second reference signal.

6. The connecting interface unit of claim 1, wherein the first reference signal comprises one of the at least one second reference signal, and the signal generating circuit comprises:
a filtering control circuit coupled to the signal detecting circuit and configured to filter the first difference signal to generate a second difference signal;
an oscillator coupled to the filtering control circuit and configured to oscillate according to the second difference signal to generate the at least one second reference signal,
wherein the transmitter circuit modulates the output data signal according to the first clock signal.

7. The connecting interface unit of claim 6, wherein the input signal is subjected to a first spread spectrum operation, wherein a loop formed by the signal detecting circuit, the filtering control circuit and the oscillator has a bandwidth smaller than a bandwidth of the first spread spectrum operation,
wherein a loop formed by the phase detector, the filter and the first phase interpolator has a bandwidth greater than the bandwidth of the first spread spectrum operation.

8. The connecting interface unit of claim 5, wherein the first reference signal comprises one of the at least one second reference signal, and the signal generating circuit further comprises:
a spread spectrum control circuit configured to provide a spread spectrum signal;
a frequency regulator configured to perform a second spread spectrum operation on one of the at least one second reference signal according to the spread spectrum signal,
wherein the transmitter circuit modulates the output data signal according to the second reference signal on which the second spread spectrum operation has been performed.

9. The connecting interface unit of claim 8, wherein the input signal is subjected to a first spread spectrum operation, and a loop formed by the signal detecting circuit, the filtering control circuit and the oscillator has a bandwidth smaller than a bandwidth of the first spread spectrum operation.

10. The connecting interface unit of claim 1, wherein a number of the at least one second reference signal is one, the first reference signal is the same as the second reference signal, and the signal detecting circuit comprises a frequency detector and a delay buffer, wherein the delay buffer is configured to delay the second reference signal to generate a plurality of third reference signals, each of the third reference signals has a phase, and the phases of the third reference signals are different from each other,
wherein the frequency detector is configured to generate the first difference signal according to the third reference signals and the input signal.

11. The connecting interface unit of claim 1, further comprising:
a receiver circuit coupled to the signal detecting circuit and the phase detector and configured to receive a signal from the host system and to compensate or filter the signal to provide the input signal.

12. The connecting interface unit of claim 11, wherein the receiver circuit is an equalizer, and the equalizer comprises:
a first inductor having a first terminal coupled to a system voltage;
a first resistor having a first terminal coupled to a second terminal of the first inductor;
a first transistor having a first terminal coupled to a second terminal of the first resistor;
a second inductor having a first terminal coupled to the system voltage;
a second resistor having a first terminal coupled to a second terminal of the second inductor;
a second transistor having a first terminal coupled to a second terminal of the second resistor;
a third resistor comprising a first terminal and a second terminal, wherein the first terminal of the third resistor is coupled to a second terminal of the first transistor, and the second terminal of the third resistor is coupled to a second terminal of the second transistor;
a first capacitor comprising a first terminal and a second terminal, wherein the first terminal of the first capacitor is coupled to the second terminal of the first transistor and the first terminal of the third resistor, and the second terminal of the first capacitor is coupled to the second terminal of the second transistor and the second terminal of the third resistor;
a first current source coupled to the second terminal of the first transistor, the first terminal of the third resistor and the first terminal of the first capacitor; and
a second current source coupled to the second terminal of the second transistor, the second terminal of the third resistor, and the second terminal of the first capacitor,
wherein the signal from the host system is input between a control terminal of the first transistor and a control terminal of the second transistor,
wherein a potential difference between the first terminal of the first transistor and the first terminal of the second transistor forms the input signal.

13. The connecting interface unit of claim 1, wherein the transmitter circuit comprises:
a second sampling circuit configured to modulate the output data signal according to the first clock signal or one of the at least one second reference signal to generate the output signal; and
a transmission driver coupled to the second sampling circuit and configured to transmit the output signal to the host system.

14. The connecting interface unit of claim 13, wherein the transmission driver comprises:
a fourth resistor having a first terminal coupled to a system voltage;
a third transistor having a first terminal coupled to a second terminal of the fourth resistor;

a fifth resistor having a first terminal coupled to the system voltage;
a fourth transistor having a first terminal coupled to a second terminal of the fifth resistor;
a third current source couple to a second terminal of the third transistor and a second terminal of the fourth transistor,
wherein the output signal is input between a control terminal of the third transistor and a control terminal of the fourth transistor,
wherein a potential difference between the first terminal of the third transistor and the first terminal of the fourth transistor forms the output signal transmitted to the host system.

15. The connecting interface unit of claim 1, wherein the signal generating circuit comprises:
a digital oscillator coupled to the first phase interpolator; and
a temperature sensing module coupled to the signal detecting circuit and the digital oscillator and configured to receive the first difference signal, to heat the digital oscillator when an amplitude of the input signal satisfies a threshold criteria, and to record a plurality of codes of the digital oscillator at a plurality of temperatures, wherein the codes are in bijection with the temperatures, and the digital oscillator generates the at least one second reference signal according to the codes,
wherein the temperature sensing module is configured to detect a current temperature of the digital oscillator when the amplitude of the input signal does not satisfy the threshold criteria, to generate a current code according to the current temperature and the codes, and to transmit the current code to the digital oscillator,
wherein the digital oscillator is configured to oscillate according to the current code to generate the at least one second reference signal.

16. The connecting interface unit of claim 15, wherein if the current temperature is one of the temperatures, the temperature sensing module is configured to use the code to which the current temperature corresponds as the current code,
wherein if the current temperature is not one of the temperatures, the temperature sensing module is configured to interpolate or extrapolate the codes according to the current temperature to generate the current code.

17. The connecting interface unit of claim 15, wherein the temperature sensing module comprises:
a register coupled to the signal detecting circuit;
a first switch coupled between the signal detecting circuit and the digital oscillator;
a second switch coupled between the register and the digital oscillator;
a heater configured to heat the digital oscillator;
a temperature sensor configured to detect the temperatures and the current temperature to output a plurality of voltages;
an analog-to-digital converter configured to convert the voltages into a plurality of digital data; and
a controller configured to store the digital data and the codes in the register,
wherein if the amplitude of the input signal satisfies the threshold criteria, the controller is configured to conduct the first switch and cut off the second switch,
wherein if the amplitude of the input signal does not satisfy the threshold criteria, the controller is configured to cut off the first switch and conduct the second switch, and to generate the current code according to the current temperature and the codes.

18. A memory storage device, comprising:
a connecting interface unit configured to be coupled to a host system;
a rewritable non-volatile memory module comprising a plurality of physical erasing units; and
a memory controller coupled to the connecting interface unit and the rewritable non-volatile memory module,
wherein the connecting interface unit does not comprise a crystal oscillator, and the connecting interface unit comprises:
a phase detector configured to receive an input signal from the host system, and to detect a phase difference between the input signal and a first reference signal to generate a first phase signal;
a filter coupled to the phase detector and configured to filter the first phase signal to generate a second phase signal;
a signal detecting circuit configured to receive the input signal, and to detect a signal character difference between the input signal and the first reference signal to generate a first difference signal;
a signal generating circuit coupled to the signal detecting circuit and configured to generate at least one second reference signal according to the first difference signal;
a first phase interpolator coupled to the filter and the signal generating circuit and configured to generate a first clock signal according to the second phase signal and the at least one second reference signal;
a first sampling circuit coupled to the first phase interpolator and configured to generate an input data signal according to the first clock signal; and
a transmitter circuit, not receiving a reference clock from a crystal oscillator, configured to modulate an output data signal according to the first clock signal or one of the at least one second reference signal to generate an output signal, and to transmit the output signal to the host system.

19. The memory storage device of claim 18, wherein the first reference signal is the same as the first clock signal, and the signal generating circuit comprises:
a filtering control circuit coupled to the signal detecting circuit and configured to filter the first difference signal to generate a second difference signal;
an oscillator coupled to the filtering control circuit and configured to generate a second clock signal according to the second difference signal;
a phase-locked loop circuit coupled to the oscillator and configured to generate the at least one second reference signal according to the second clock signal,
wherein the transmitter circuit is coupled to the phase-locked loop circuit, and modulates the output data signal according to one of the at least one second reference signal.

20. The memory storage device of claim 18, wherein the signal generating circuit further comprises:
a filtering control circuit coupled to the signal detecting circuit and configured to filter the first difference signal to generate a second difference signal,
wherein the filtering control circuit is configured to store an oscillation information of the second difference signal when an amplitude of the input signal satisfies a threshold criteria,
wherein the filtering control circuit is configured to provide the oscillation information when the amplitude of the input signal does not satisfy the threshold criteria, and the signal generating circuit is configured to generate the at least one second reference signal according to the oscillation information.

21. The memory storage device of claim 18, wherein the first reference signal comprises one of the at least one second reference signal, and the signal generating circuit comprises:
a filtering control circuit coupled to the signal detecting circuit and configured to filter the first difference signal to generate a second difference signal;
a register configured to provide an initial oscillation information;
a digital oscillator configured to oscillate according to the initial oscillation information to generate a second clock signal;
a phase-locked loop circuit coupled to the digital oscillator and configured to generate a third clock signal according to the second clock signal;
a second phase interpolator coupled to the filtering control circuit and the phase-locked loop circuit and configured to generate the at least one second reference signal according to the second difference signal and the third clock signal,
wherein the transmitter circuit modulates the output data signal according to one of the at least one second reference signal.

22. The memory storage device of claim 18, wherein the first reference signal comprises one of the at least one second reference signal, and the signal generating circuit comprises:
a filtering control circuit coupled to the signal detecting circuit and configured to filter the first difference signal to generate a second difference signal;
an oscillator coupled to the filtering control circuit and configured to oscillate according to the second difference signal to generate the at least one second reference signal,
wherein the transmitter circuit modulates the output data signal according to one of the at least one second reference signal.

23. The memory storage device of claim 18, wherein the first reference signal comprises one of the at least one second reference signal, and the signal generating circuit comprises:
a filtering control circuit coupled to the signal detecting circuit and configured to filter the first difference signal to generate a second difference signal;
an oscillator coupled to the filtering control circuit and configured to oscillate according to the second difference signal to generate the at least one second reference signal,
wherein the transmitter circuit modulates the output data signal according to the first clock signal.

24. The memory storage device of claim 23, wherein the input signal is subjected to a first spread spectrum operation, wherein a loop formed by the signal detecting circuit, the filtering control circuit and the oscillator has a bandwidth smaller than a bandwidth of the first spread spectrum operation,
wherein a loop formed by the phase detector, the filter and the first phase interpolator has a bandwidth greater than the bandwidth of the first spread spectrum operation.

25. The memory storage device of claim 22, wherein the first reference signal comprises one of the at least one second reference signal, and the signal generating circuit further comprises:
a spread spectrum control circuit configured to provide a spread spectrum signal;
a frequency regulator configured to perform a second spread spectrum operation on one of the at least one second reference signal according to the spread spectrum signal,
wherein the transmitter circuit modulates the output data signal according to the second reference signal on which the second spread spectrum operation has been performed.

26. The memory storage device of claim 25, wherein the input signal is subjected to a first spread spectrum operation, and a loop formed by the signal detecting circuit, the filtering control circuit and the oscillator has a bandwidth smaller than a bandwidth of the first spread spectrum operation.

27. The memory storage device of claim 18, wherein a number of the at least one second reference signal is one, the first reference signal is the same as the second reference signal, and the signal detecting circuit comprises a frequency detector and a delay buffer,
wherein the delay buffer is configured to delay the second reference signal to generate a plurality of third reference signals, each of the third reference signals having a phase, the phases of the third reference signals being different from each other,
wherein the frequency detector generates the first difference signal according to the third reference signals and the input signal.

28. The memory storage device of claim 18, wherein the connecting interface unit further comprises:
a receiver circuit coupled to the signal detecting circuit and the phase detector and configured to receive a signal from the host system and to compensate or filter the signal to provide the input signal.

29. The memory storage device of claim 28, wherein the receiver circuit is an equalizer, and the equalizer comprises:
a first inductor having a first terminal coupled to a system voltage;
a first resistor having a first terminal coupled to a second terminal of the first inductor;
a first transistor having a first terminal coupled to a second terminal of the first resistor;
a second inductor having a first terminal coupled to the system voltage;
a second resistor having a first terminal coupled to a second terminal of the second inductor;
a second transistor having a first terminal coupled to a second terminal of the second resistor;
a third resistor comprising a first terminal and a second terminal, wherein the first terminal of the third resistor is coupled to a second terminal of the first transistor, and the second terminal of the third resistor is coupled to a second terminal of the second transistor;
a first capacitor comprising a first terminal and a second terminal, wherein the first terminal of the first capacitor is coupled to the second terminal of the first transistor and the first terminal of the third resistor, and the second terminal of the first capacitor is coupled to the second terminal of the second transistor and the second terminal of the third resistor;
a first current source coupled to the second terminal of the first transistor, the first terminal of the third resistor and the first terminal of the first capacitor; and
a second current source coupled to the second terminal of the second transistor, the second terminal of the third resistor, and the second terminal of the first capacitor,
wherein the signal from the host system is input between a control terminal of the first transistor and a control terminal of the second transistor, wherein a potential difference between the first terminal of the first transistor and the first terminal of the second transistor forms the input signal.

30. The memory storage device of claim 18, wherein the transmitter circuit comprises:
   a second sampling circuit configured to modulate the output data signal according to the first clock signal or one of the at least one second reference signal to generate the output signal; and
   a transmission driver coupled to the second sampling circuit and configured to transmit the output signal to the host system.

31. The memory storage device of claim 30, wherein the transmission driver comprises:
   a fourth resistor having a first terminal coupled to a system voltage;
   a third transistor having a first terminal coupled to a second terminal of the fourth resistor;
   a fifth resistor having a first terminal coupled to the system voltage;
   a fourth transistor having a first terminal coupled to a second terminal of the fifth resistor;
   a third current source couple to a second terminal of the third transistor and a second terminal of the fourth transistor,
   wherein the output signal is input between a control terminal of the third transistor and a control terminal of the fourth transistor,
   wherein a potential difference between the first terminal of the third transistor and the first terminal of the fourth transistor forms the output signal transmitted to the host system.

32. The memory storage device of claim 18, wherein the signal generating circuit comprises:
   a digital oscillator coupled to the first phase interpolator; and
   a temperature sensing module coupled to the signal detecting circuit and the digital oscillator and configured to receive the first difference signal, to heat the digital oscillator when an amplitude of the input signal satisfies a threshold criteria, and to record a plurality of codes of the digital oscillator at a plurality of temperatures, wherein the codes are in bijection with the temperatures, and the digital oscillator generates the at least one second reference signal according to the codes,
   wherein the temperature sensing module is configured to detect a current temperature of the digital oscillator when the amplitude of the input signal does not satisfy the threshold criteria, to generate a current code according to the current temperature and the codes, and to transmit the current code to the digital oscillator,
   wherein the digital oscillator is configured to oscillate according to the current code to generate the at least one second reference signal.

33. The memory storage device of claim 32, wherein if the current temperature is one of the temperatures, the temperature sensing module is configured to use the code to which the current temperature corresponds as the current code,
   wherein if the current temperature is not one of the temperatures, the temperature sensing module is configured to interpolate or extrapolate the codes according to the current temperature to generate the current code.

34. The memory storage device of claim 32, wherein the temperature sensing module comprises:
   a register coupled to the signal detecting circuit;
   a first switch coupled between the signal detecting circuit and the digital oscillator;
   a second switch coupled between the register and the digital oscillator;
   a heater configured to heat the digital oscillator;
   a temperature sensor configured to detect the temperatures and the current temperature to output a plurality of voltages;
   an analog-to-digital converter configured to convert the voltages into a plurality of digital data; and
   a controller configured to store the digital data and the codes in the register,
   wherein if the amplitude of the input signal satisfies the threshold criteria, the controller is configured to conduct the first switch and cut off the second switch,
   wherein if the amplitude of the input signal does not satisfy the threshold criteria, the controller is configured to cut off the first switch and conduct the second switch, and to generate the current code according to the current temperature and the codes.

* * * * *